United States Patent
Zemer et al.

(10) Patent No.: US 6,834,243 B2
(45) Date of Patent: Dec. 21, 2004

(54) APPARATUS AND METHOD FOR ELECTRICAL TESTING OF ELECTRICAL CIRCUITS

(75) Inventors: Dan Zemer, Rehovot (IL); Eyal Harel, Tel Aviv (IL)

(73) Assignee: Orbotech Ltd., Yavne (IL)

( * ) Notice: Subject to any disclaimer, the term of this patent is extended or adjusted under 35 U.S.C. 154(b) by 21 days.

(21) Appl. No.: 09/906,798

(22) Filed: Jul. 18, 2001

(65) Prior Publication Data

US 2002/0013667 A1 Jan. 31, 2002

Related U.S. Application Data

(60) Provisional application No. 60/219,276, filed on Jul. 19, 2000.

(51) Int. Cl.[7] ............................................. G01R 31/00
(52) U.S. Cl. .......................... 702/57; 702/117; 702/118; 324/758
(58) Field of Search ............................... 702/57–59, 64, 702/65, 108, 117, 118, 121, 124, 183, 185, 189, FOR 171, FOR 103–FOR 106, FOR 134, FOR 170; 324/754–759, 761, 537, 72.5, 765, 555, 690; 438/14, 17, 10, 11; 700/119–121; 356/237.4, 237.5; 382/144, 145, 147, 149

(56) References Cited

U.S. PATENT DOCUMENTS

| | | | |
|---|---|---|---|
| 4,544,889 A | 10/1985 | Hendriks et al. | 324/158 P |
| 4,633,176 A | 12/1986 | Reimer | 324/158 P |
| 4,908,571 A | 3/1990 | Stoehr | 324/158 P |
| 5,153,472 A | 10/1992 | Karidis et al. | 310/13 |
| 5,328,149 A | 7/1994 | Reuter | 251/129.06 |
| 5,532,611 A | 7/1996 | Lo et al. | 324/758 |
| 5,550,483 A | 8/1996 | Boyette, Jr. et al. | 324/758 |
| 5,596,283 A | 1/1997 | Mellitz et al. | 324/754 |
| 5,635,848 A | 6/1997 | Hammond et al. | 324/758 |
| 5,635,849 A | 6/1997 | Lo et al. | 324/758 |
| 5,757,159 A | 5/1998 | Boyette, Jr. et al. | 318/649 |
| 5,761,156 A | 6/1998 | Reuter et al. | 367/140 |
| 5,804,982 A | 9/1998 | Lo et al. | 324/758 |
| 5,892,366 A | 4/1999 | Byers | 324/758 |
| 5,900,691 A | 5/1999 | Reuter et al. | 310/348 |
| 6,118,288 A | 9/2000 | Kang | 324/754 |
| 6,124,722 A | 9/2000 | Vodopivec et al. | 324/761 |
| 6,130,547 A | 10/2000 | Kato | 324/761 |
| 6,191,522 B1 | 2/2001 | Reuter | 310/328 |
| 6,307,389 B1 * | 10/2001 | Buks et al. | 324/758 |
| 6,459,945 B1 * | 10/2002 | Singh et al. | 700/108 |
| 2001/0028254 A1 | 10/2001 | Buks et al | 324/754 |
| 2002/0153909 A1 * | 10/2002 | Petersen et al. | 324/754 |

FOREIGN PATENT DOCUMENTS

| | | |
|---|---|---|
| DE | 19503329 A | 8/1996 |
| DE | 19817802 A1 | 10/1999 |
| EP | 0293497 A1 | 12/1988 |
| EP | 0468153 B1 | 1/1992 |
| EP | 0468153 A1 * | 1/1992 |
| GB | 2294365 A | 4/1996 |
| WO | WO 95/29406 A1 | 11/1995 |

OTHER PUBLICATIONS

Prokopp, Translation of EP 0468153 A1, Jan. 29, 1992.*

* cited by examiner

*Primary Examiner*—Hal Wachsman
(74) *Attorney, Agent, or Firm*—Sughrue Mion, PLLC

(57) ABSTRACT

Apparatus for electrical testing of electrical circuits includes an array of probes arranged for selective engagement with portions of electrical circuits to be tested, testing circuitry associated with the array of probes for sensing electrical characteristics of the electrical circuits engaged by the array of probes, and control circuitry associated with the array of probes for causing engagement between selected ones of the array of probes with selected ones of the portions of electrical circuits to be tested. The array of probes includes at least two static probe assemblies arranged in a fixed array, and the static probe assemblies include a selectively positionable probe element and a probe element positioner. The apparatus is employed to test electrical circuits during fabrication.

30 Claims, 19 Drawing Sheets

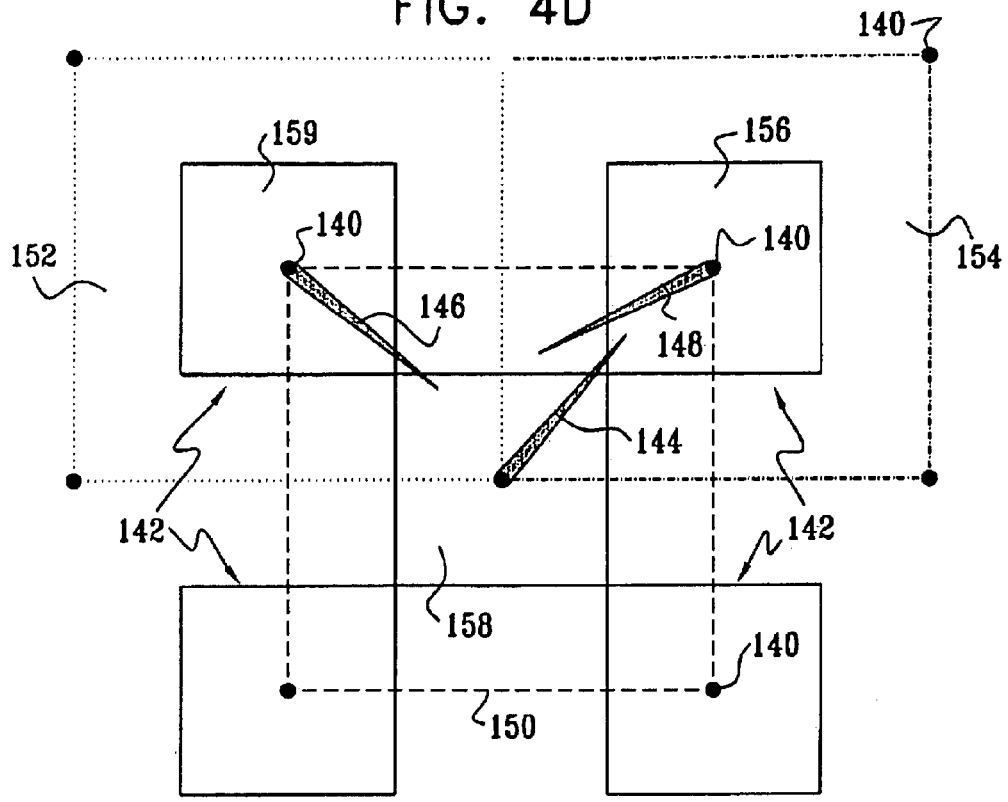
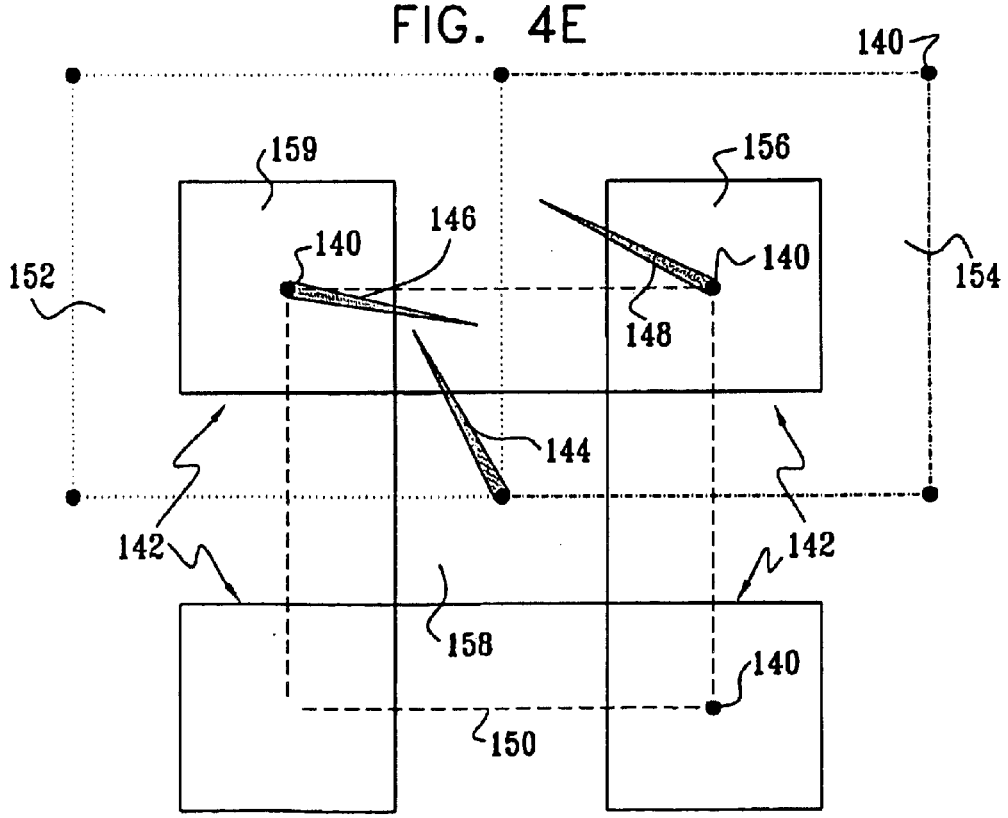

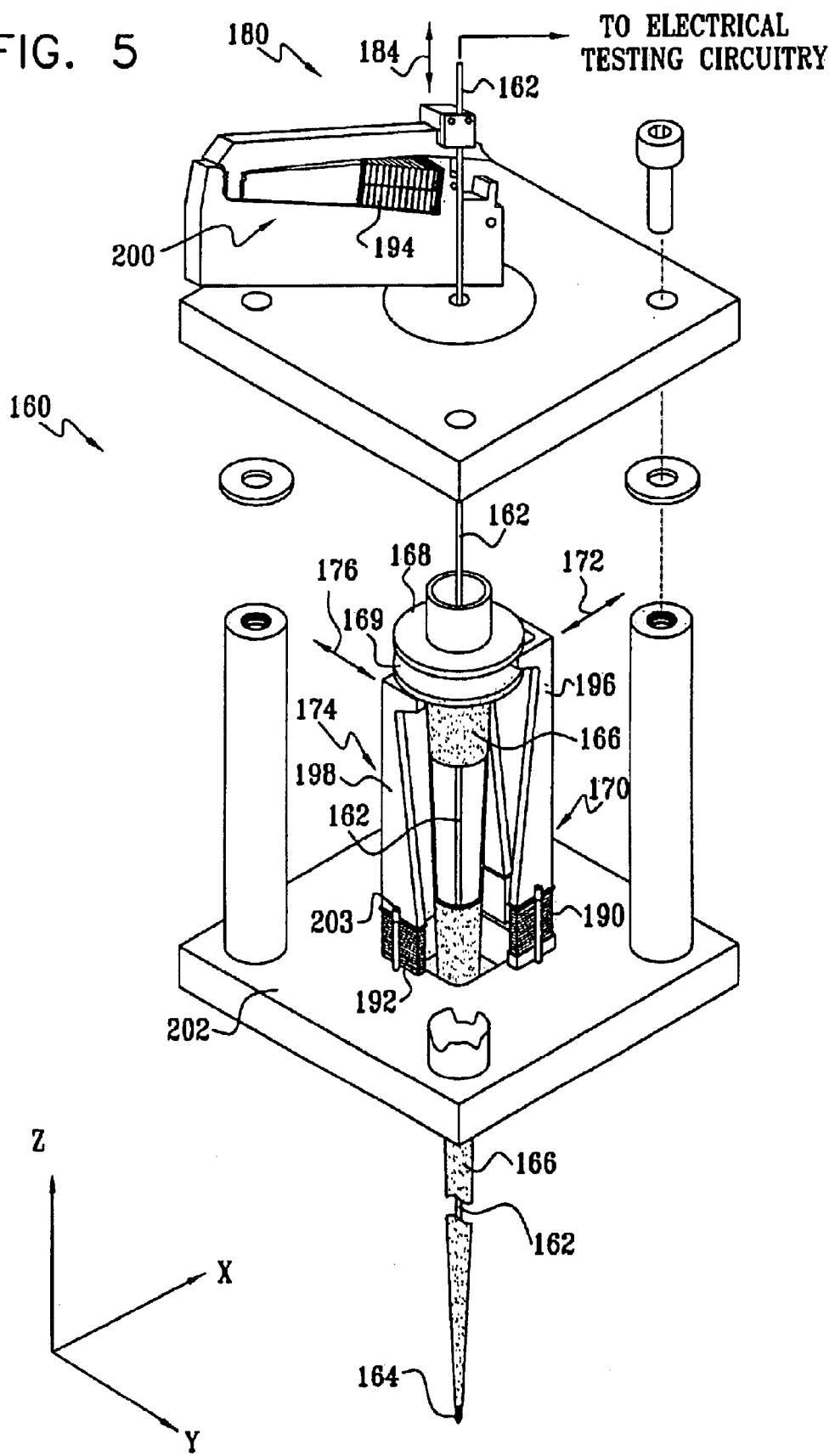

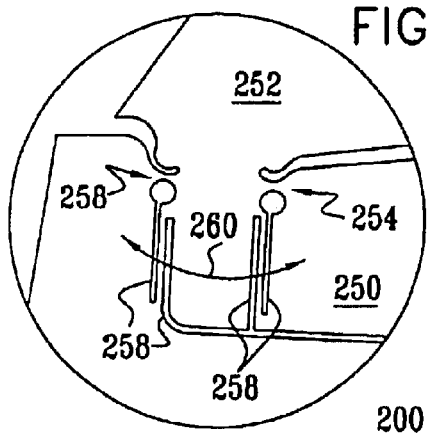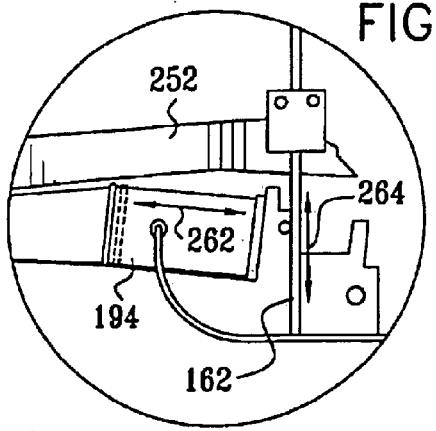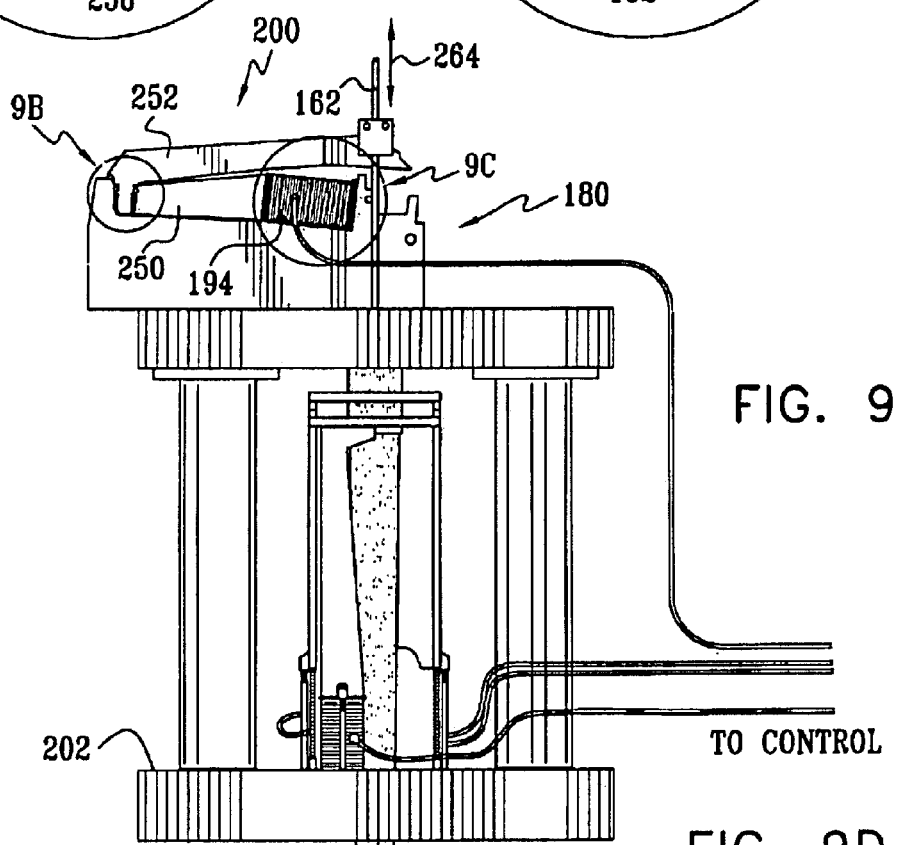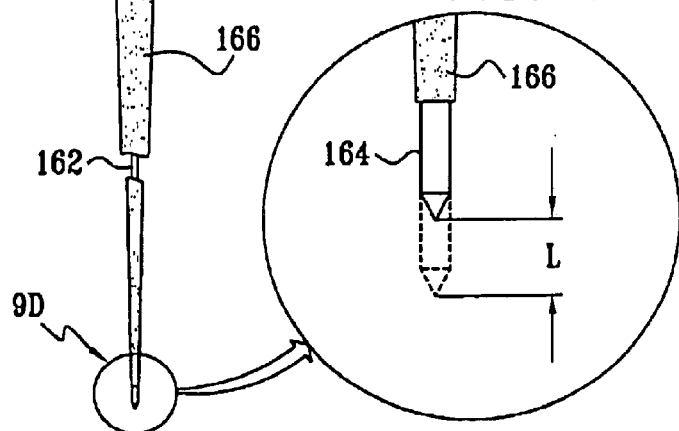

FIG. 11

SELECTABLY ENGAGE PORTIONS OF ELECTRICAL CIRCUITS TO BE TESTED WITH INDEPENDENTLY POSITIONABLE PROBES, EACH PROBE BEING PART OF A STATIC PROBE ASSEMBLY LOCATED IN A FIXED ARRAY OF STATIC PROBE ASSEMBLIES

↓

SENSE AN ELECTRICAL CHARACTERISTIC OF ENGAGED PORTIONS OF ELECTRICAL CIRCUITS TO BE TESTED

FIG. 12

SELECTABLY ENGAGE PORTIONS OF ELECTRICAL CIRCUITS TO BE TESTED WITH PROBES THAT ARE EACH ASSOCIATED WITH A STATIC PROBE ASSEMBLY IN A FIXED ARRAY OF STATIC PROBE ASSEMBLIES AND THAT ARE EACH INDEPENDENTLY POSITIONABLE OVER A REGION WHICH IS GENERALLY NON-OVERLAPPING WITH A CORRESPONDING REGION OF ANOTHER NON-ADJACENT PROBE

↓

SENSE AN ELECTRICAL CHARACTERISTIC OF ENGAGED PORTIONS OF ELECTRICAL CIRCUITS TO BE TESTED

FIG. 13

```
SELECTABLY ENGAGE PORTIONS OF ELECTRICAL CIRCUITS
TO BE TESTED WITH PROBES THAT ARE EACH ASSOCIATED
WITH A STATIC PROBE ASSEMBLY IN A FIXED ARRAY OF
STATIC PROBE ASSEMBLIES AND THAT ARE EACH
INDEPENDENTLY POSITIONABLE OVER A REGION WHICH IS
PARTIALLY OVERLAPPING WITH A CORRESPONDING REGION
OF AN ADJACENT PROBE
          ↓
SENSE AN ELECTRICAL CHARACTERISTIC OF ENGAGED
PORTIONS OF ELECTRICAL CIRCUITS TO BE TESTED
```

FIG. 14

```
FORM A PLURALITY OF DIFFERENT PROBE POSITION
PATTERNS WITH AN ARRAY OF INDEPENDENTLY
POSITIONABLE PROBES
          ↓
IN EACH PROBE PATTERN - ENGAGE SELECTED
PORTIONS OF ELECTRICAL CIRCUITS TO BE TESTED WITH
THE PROBES
          ↓
SENSE AN ELECTRICAL CHARACTERISTIC OF ENGAGED
PORTIONS OF ELECTRICAL CIRCUITS TO BE TESTED
```

APPARATUS AND METHOD FOR ELECTRICAL TESTING OF ELECTRICAL CIRCUITS

This application claims the benefit of provisional application No. 60/219,276, filed Jul. 19, 2000.

FIELD OF THE INVENTION

The present invention generally relates to apparatus and methods for electrical testing of circuits generally and more particularly to apparatus and methods for suitable for fixtureless electrical testing of electrical circuits.

BACKGROUND OF THE INVENTION

There exist a wide variety of apparatus for electrical testing of electrical circuits. These apparatus include non-contact systems such as electron beam, laser plasma and electrical field testers, and contact systems such as bed-of-nails and flying probe testers. Conventional apparatus for electrical testing of electrical circuits suffer from one or more of the following drawbacks: high cost of operation, high set-up cost for different circuit board configurations, slow speed, inability to accurately and detect, in a repeatable fashion, various types of defects in electrical circuits under test.

SUMMARY OF THE INVENTION

The present invention seeks to provide improved apparatus and methods for fixtureless electrical testing of electrical circuits.

In accordance with a general aspect of the invention there is provided at least one electrical testing array comprising at least two electrical testing probes. Each probe is configured to be selectively positionable and to engage selected portions of an electrical circuit board. At selected points of engagement, electrical characteristics of the selected electrical circuits are sensed.

Embodiments of the present invention include one or more of the following additional features:

At least some of the probes include a static probe assembly, located in a fixed position in an array of probe assemblies, and a selectively positionable probe element.

At least some, and preferably all, positionable probe elements are independently positionable relative to other probe elements.

Each probe element is operative to engage a portion of the electrical circuit located within a region of engagement, and the respective regions of engagement of adjacent probe elements at least partially overlap.

Each probe element is each operative to engage a portion of the electrical circuit located within a region of engagement, and the respective regions of engagement of non-adjacent probe elements generally do not overlap.

Control circuitry is provided to position each of the probe elements so as to provide a selectively configurable electrical testing pattern.

The control circuitry is operative to move at least some of the probe elements, while at the same time, other probe elements are held in position for sensing an electrical characteristic of an electrical circuit on an electrical circuit board to be tested.

The control circuitry is operative to position the probe elements into a sequence of different electrical testing patterns, and to test different parts of an electrical circuit on an electrical circuit board to be tested when the probe elements are in each of the various electrical testing patterns.

First and second testing arrays, each comprising probe elements, are respectively provided along each side of an electrical circuit board to be tested, and a testing pattern includes probe elements suitably positioned along both sides of the electrical circuit to sense a characteristic of an electrical circuit that passes through the electrical circuit board to be tested.

First and second testing arrays, each comprising probe elements, are respectively provided along each side of an electrical circuit board to be tested, and the probe elements are sequentially positioned into a sequence of testing patterns, each testing pattern including probe elements suitably positioned along both sides of the electrical circuit, to sequentially sense a characteristic of different parts of an electrical circuit that passes through the electrical circuit board to be tested.

The probe elements are contact probe elements operative to engage selected electrical circuits by physical contact. Alternatively the probe elements may be non-contact probe elements operative to electrically engage selected electrical circuits, without physical contact, for example, by plasma.

In accordance with an additional general aspect of the invention, a method for electrically testing electrical circuits includes sensing electrical characteristics of portions of electrical circuits to be tested by selectively engaging the portions to be tested with probes that are each associated with a static probe assembly arranged in a fixed array of static probe assemblies. The probes are each independently positionable within a region that partially overlaps the corresponding region of an adjacent probe assembly, and that generally does not overlap the corresponding region of a non-adjacent probe assembly.

In accordance with an additional general aspect of the invention, a method for manufacturing electrical circuits includes depositing a pattern of electrical circuit conductors on a multi-layered substrate, and testing an electrical characteristic of selected portions of the electrical circuit using a multiplicity of static probe assemblies which are located in a fixed array of probe assemblies and which each have an independently positionable probe element.

BRIEF DESCRIPTION OF THE DRAWINGS

The present invention will be understood and appreciated more fully from the following detailed description, taken in conjunction with the drawings in which:

FIGS. 4D and 4E are simplified top view illustrations of another sequence of multiple probe electrical circuit contact engagements provided by the system of FIGS. 1A–3B;

FIG. 5 is a partially exploded and partially cut-away pictorial illustration of probe assembly employed in the system of FIG. 1A;

FIG. 9A is a simplified side view pictorial illustrating operation, along a third axis, of a first embodiment of a probe assembly employed in the system of FIG. 1A;

FIGS. 9B–9D are magnified views of respective portions of the probe assembly seen in FIG. 9A to illustrate its operation;

FIGS. 11–14 are simplified flow diagrams of methods for testing electrical circuits using the systems and apparatus of FIGS. 1A–9D

DETAILED DESCRIPTION OF THE INVENTION

Figure 1:
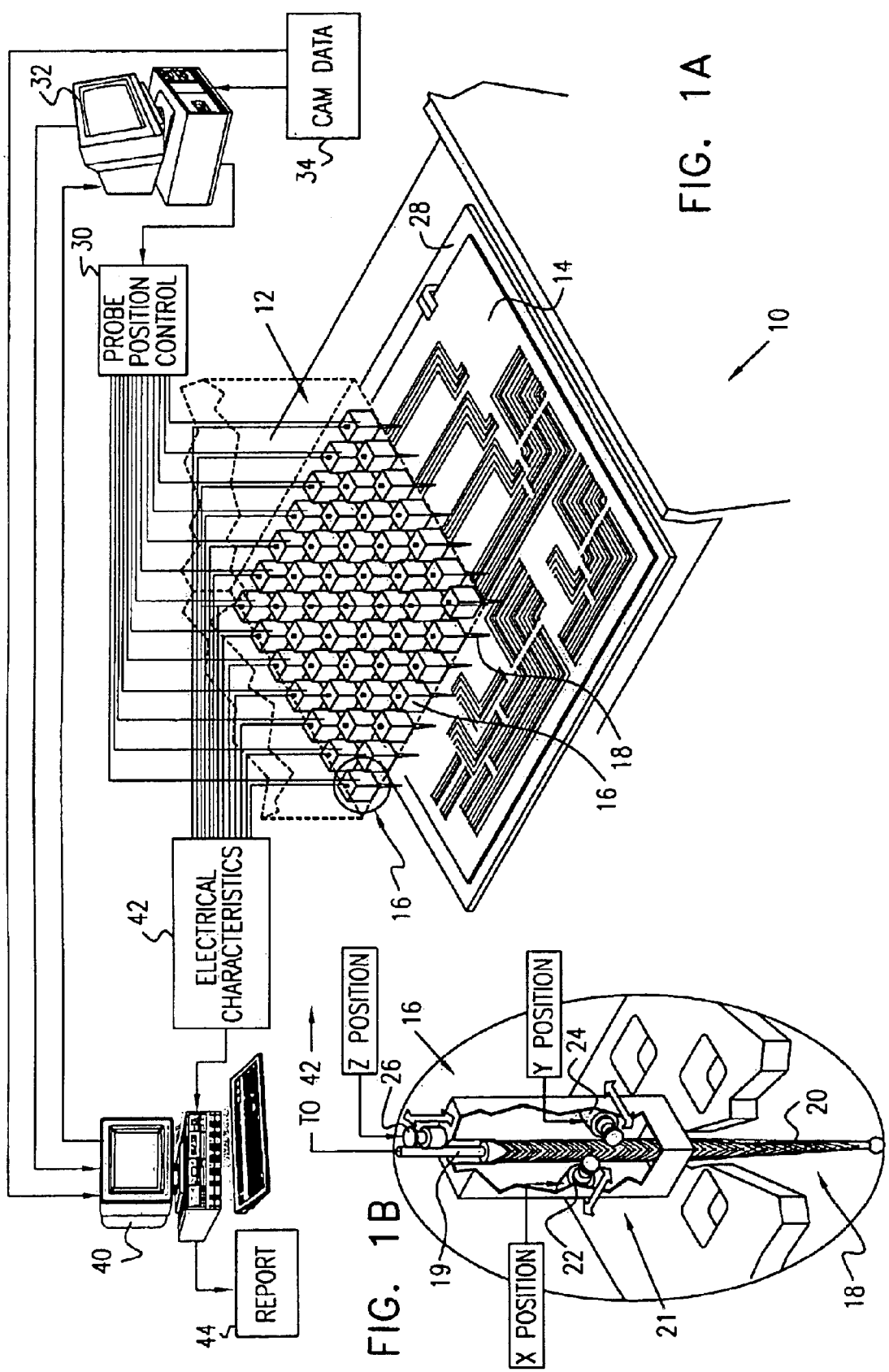
FIG. 1A is a simplified, part pictorial, part block-diagram illustration of apparatus for fixtureless electrical testing of electrical circuits constructed and operative in accordance with the invention.
FIG. 1B is a magnified, partial sectional view of a probe assembly shown in FIG. 1A.

Reference is now made to FIG. 1A which is a simplified, part pictorial, part block-diagram illustration of a fixtureless electrical testing system 10 for electrically testing electrical circuits, constructed and operative in accordance with the one embodiment or example of the present invention. The term "electrical circuits" as used throughout the following description shall be deemed to include complete electrical circuits as well as nets and other interconnected and interconnectable portions of electrical circuits, which, when suitably interconnected, form a completed electrical circuit.

As seen in FIG. 1A, system 10 includes an array of probes 12 which are arranged for selectable engagement with portions of an electrical circuit 14 to be tested. The array of probes 12 comprises a multiplicity of static probe assemblies 16 (shown magnified in FIG. 1B) arranged in a fixed array. Each of said static probe assemblies 16 includes a selectively positionable probe element 18, typically formed of a conductive metal core 19 surrounded by and movable within a carbon fiber, or other suitable fiber, mesh housing 20, and at least one probe element positioner 21 operative to move a respective probe element 18 to a selectable position within a range of possible positions. Array 12 may be provided on a single side of electrical circuit 14, or alternatively an array 12 may be provided along each side thereof in order to enable testing of portions of electrical circuit 14 that are interconnected and that have contacts located on both sides of electrical circuit 14.

System 10 typically includes probe position control circuitry 30 associated with the array of probes 12. Circuitry 30 is operative to selectively position probes 18 and to cause engagement between selected probes 18 and selected portions of electrical circuit 14 to be tested. As seen in greater detail in FIG. 1B, probe assembly 16 may have associated therewith several positioners 21, including an X positioner 22 operable to position probe element 18 along an X axis; a Y positioner 24 operable to position probe element 18 along a Y axis; and a Z positioner 26 operable to provide up-down positioning to the conductive metal core 19 disposed inside probe element 18 and to control the pressure applied by the conductive metal core 19 of probe element 18 when engaging a selected portion of electrical circuit 14.

It is appreciated that separate positioners 21, as seen in FIG. 1B, or alternatively a single unit operable to provide each of the desired positioning functions (not shown), may be employed to position probe 18. Moreover, a variety of positioner constructions may be employed to provide suitable selectable X-Y and/or Z axis positioning and contact between individual probes and portions of electrical circuit 14. Suitable positioners include micro motors, nano motors and piezo-electric positioners. A configuration for the construction of probes 18, which is to be considered exemplary and non-limiting, is described hereinbelow with reference to FIGS. 5–10B. It is further appreciated that array 12 may be arranged so that each probe assembly 16 provides suitable X-Y positioning for a probe 18, while a global positioner (not shown), in cooperation with support table 28 that supports electrical circuit 14 and/or in cooperation with array 12, moves electrical circuit 14 and array 12 into and out of mutual contact.

In various embodiments of the present invention a computer 32 receives an input from CAD and/or CAM data 34 describing the layout of electrical circuit 14 to be tested, and processes the data 34 to determine a suitable position for each probe element 18 in array 12 as is necessary to perform one or more desired electrical tests on various portions of circuit 14. Processing to determine a suitable position for a probe, and/or to determine an appropriate signal, such as electrical current, needed to position probe in such position, may be performed partially or entirely in an offline operation prior to testing an electrical circuit 14 to be tested. Thus processing to determine a suitable position for each probe element 18 may be stored in memory (not shown) or may be computed, in whole or in part, on the fly.

The results of processing to determine a suitable position for each probe element 18 may be employed by computer 32 to devise a testing program for an electrical circuit to be tested 14. Position information for each probe is sent to probe position controller 30, which at the appropriate time provides suitable position control instructions for each positioner 21.

Electrical circuit testing circuitry 40, associated with the probe elements 18 in the array of probes 12, is provided to sense a variety of electrical characteristics 42 of portions of electrical circuit 14 engaged by various probes 12. Tests typically include, for example, testing between various exposed leads in electrical circuit 14, to determine impedance, capacitance, a presence or absence of electrical contact, or other desirable electrical characteristics.

The testing of electrical testing of an electrical circuit 14 using system 10 typically is conducted in a sequence of tests for which at least some probes 18 simultaneously engage, at each step in the sequence, a multiplicity of portions of electrical circuit 14. The position of one or more probes 18 is modified for each stage of the testing sequence. Additionally, one or more electrical tests can be performed using different combinations of probe elements 18.

As seen in FIG. 1A, electrical testing circuitry 40 receives inputs from CAM data 34, and/or data from computer 32 and/or data from probe position control circuitry 30 (connection not shown), to enable correlating between sensed electrical characteristics and particular portions of electrical circuit 14. Test results of electrical characteristics 42 are compared to reference test results (not shown) for a known-to-be-good electrical circuit 14 of the type being tested, and a report 44 is provided to indicate those portions of the electrical circuit 14 being tested which have a suitable electrical characteristic and/or portions of the electrical circuit 14 which are deficient or defective.

Reference test results may be received directly from CAM data 34, or may be calculated for each portion of circuit 14 tested based on inputs from CAM data 34, or may be stored in memory based on the results of previous electrical testing of a similar electrical circuit, which is known to be not defective.

It is appreciated that computer 32 and electrical testing circuitry 40 may be separate computer units, as shown, or they may be parts of a single circuitry unit. Moreover, it is seen in FIG. 1A that electrical testing circuitry 40 may provide feedback to computer 32. Such feedback may be used, for example, to enable repeat testing of portions of electrical circuit 14, whose sensed electrical characteristics are not in accordance with a desired test result. Thus feedback may be employed to reposition probe assemblies 18 so that a portion of electrical circuit 14 suspected of being defective may be retested to ascertain the presence of a real defect or of a false alarm.

Figure 2:
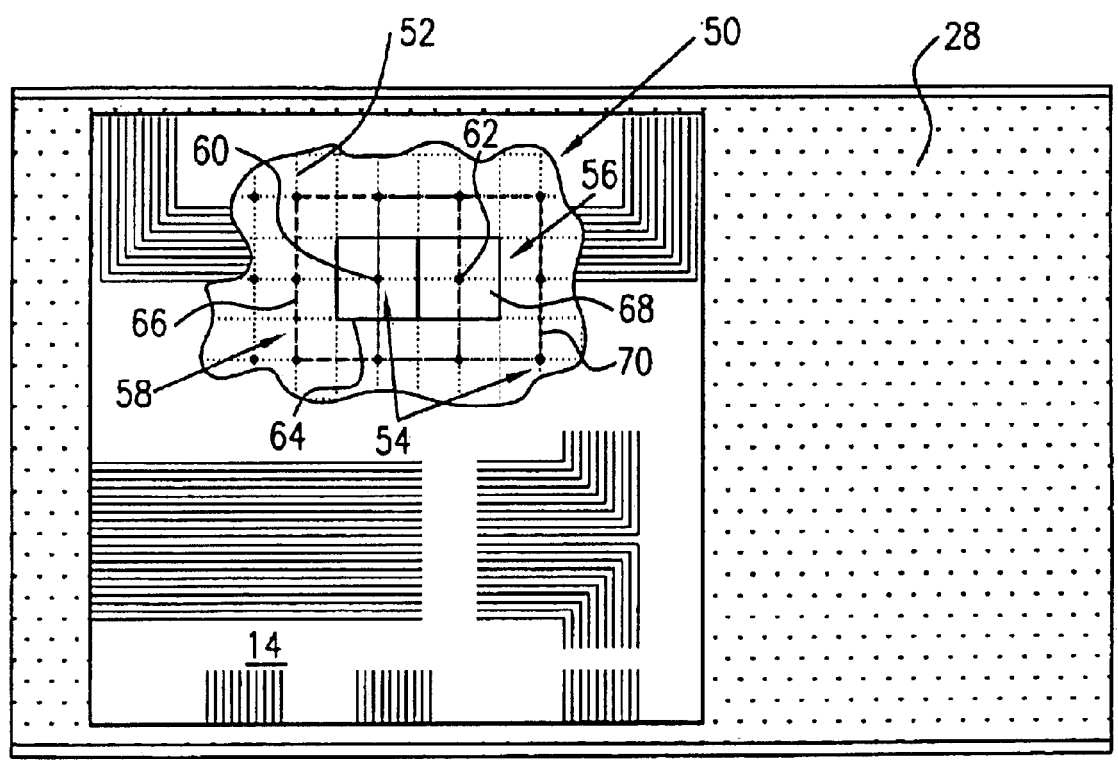
FIG. 2 is a simplified diagram illustrating both usual and extended spatial ranges of probes in two dimensions.

Reference is now made to FIG. 2 which is a simplified top view diagram illustrating both usual and extended spatial ranges of probes in two dimensions. It is seen in FIG. 2 that a printed circuit board 14 to be tested is situated on support table 28, such as a vacuum table, operative to hold down printed circuit board 14. A region 50 of electrical circuit 14 is seen overlaid with a virtual grid 52 serving as an illustrative frame of reference to show the locations of spatial ranges covered by probe assembles 16 (FIG. 1A).

Each probe 18 (FIG. 1A), represented by a nominal central probe location marker 54, is selectively positionable within a usual spatial range, typically square shaped, centered about a marker 54 and generally indicated by reference numeral 56. In addition, each probe 18, represented by a nominal central probe location marker 54 is additionally selectively positionable within an extended range, typically square shaped, centered about marker 54 and generally indicated by reference numeral 58. Each probe 18 is selectively positionable within its respective usual and extended spatial range independently of other probes 18 in array 12. Seen in FIG. 2 are two central probe location markers 60 and 62. The usual and extended spatial ranges surrounding marker 60 are designated 64 and 66 respectively. The usual and extended spatial ranges surrounding marker 62 are designated 68 and 70 respectively. It is appreciated that the corresponding usual spatial ranges 56 and extended spatial ranges 58 are associated with each of probes 18 in array 12 (FIG. 1A), including those located outside region 50.

In the arrangement of FIG. 2 it is seen that usual and extended spatial ranges for probes 18 have the following layout configurations, one or more of which typically is present in systems constructed in accordance with the invention: (1) the usual spatial range 56 associated with a first probe 18, such as usual spatial range 64 associated with the probe corresponding to marker 60, is non-overlapping with the usual spatial range 58 of an adjacent probe 18, such as usual spatial range 68 associated with the probe corresponding to marker 62; (2) the usual spatial ranges 56 and the corresponding extended spatial ranges 58 associated with a probe 18, for example usual spatial range 64 and extended spatial range 66 associated with the probe corresponding to marker 60, generally are non-overlapping with usual spatial ranges 56 and extended spatial ranges 58 of other probes 18 that are not adjacent thereto; (3) the extended spatial range 58 associated with a probe 18, for example, extended spatial range 66 associated with the probe corresponding to marker 60, generally is partially overlapping with the extended spatial ranges of probe elements 18 that are adjacent thereto, such as extended spatial range 70 associated with the probe corresponding to marker 62; and (4) each elemental area on electrical circuit 14 to be tested can be addressed by at least two probes 18 (FIG. 1A).

The dimensions of a usual spatial range 56 may be between ½"×½"–2"×2", and typically are about 1"×1". The linear dimension of each side of an extended spatial range 58 may be between 1.5×–3× the linear dimension of a corresponding side of a usual spatial range 56, and is preferably about 2× larger. Thus the area of an extended spatial range 58 preferably is about 4× larger than the area of a usual spatial range 56 so as to partially overlap into extended spatial ranges associated with neighboring probes 18.

It is appreciated that the arrangement of probes 18 shown in FIG. 2 is merely one example of a possible layout of probe elements. Thus, for example, an arrangement may be provided in which every other probe is eliminated from the pattern shown in FIG. 2, without deviating from the aforementioned design principals, including the enabling each elemental area of electrical circuit 14 to be addressed by at least two probes 18. It is well within the capacity of persons skilled in the art to design suitable alternative probe layouts, and the choice of a suitable probe layout will be a function of engineering design, system cost, and desired degree of redundancy.

Figure 3A:
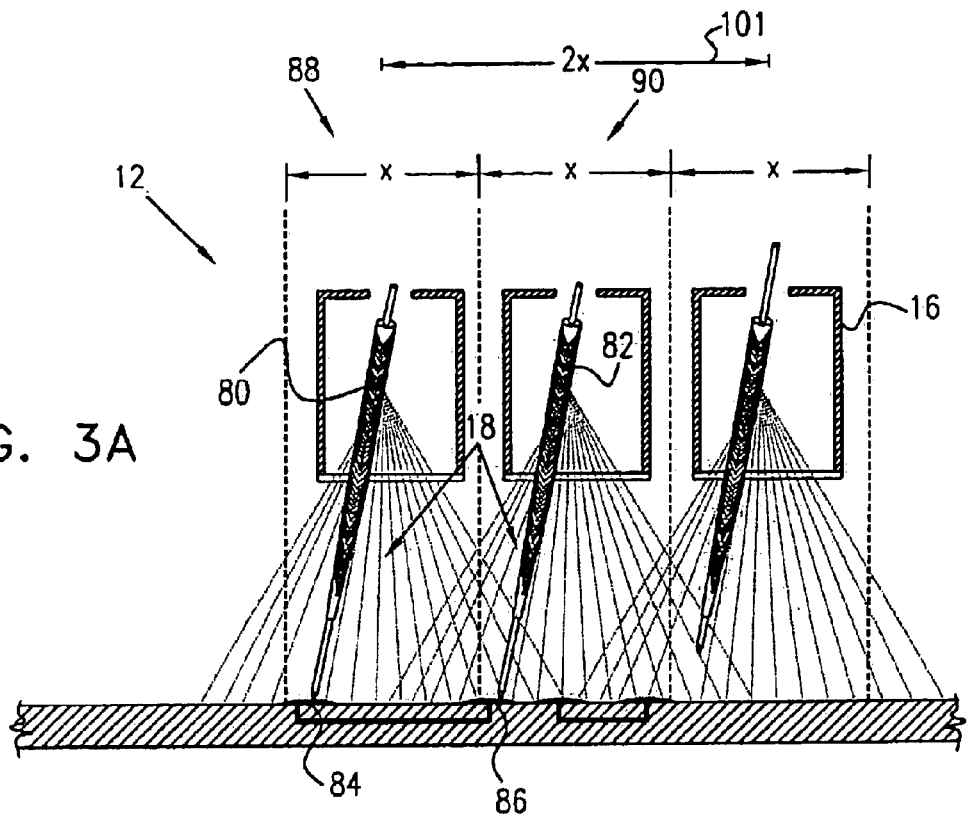
FIGS. 3A and 3B are a simplified diagrams taken in a plane perpendicular to that shown in FIG. 2 and illustrating both usual and extended spatial ranges of probes in two dimensions.
Figure 3B:
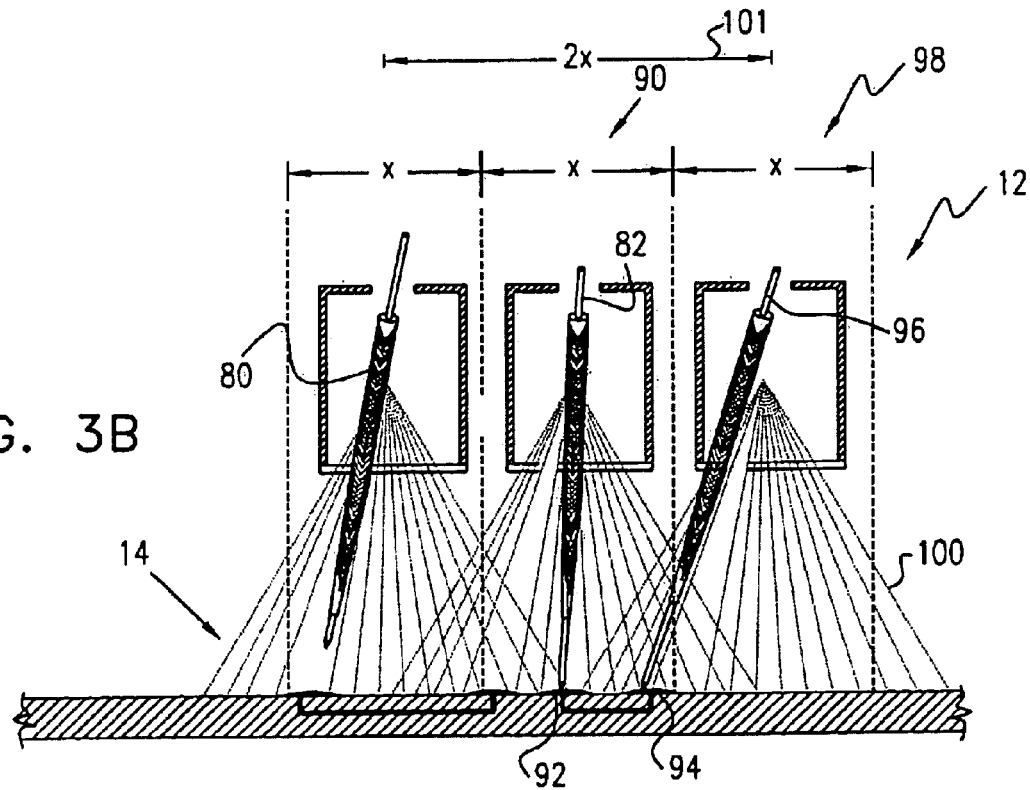

Reference is now made to FIGS. 3A and 3B which are simplified diagrams taken in a plane perpendicular to that shown in FIG. 2 illustrating both usual and extended spatial ranges of probes 18 in two dimensions. Typically probes 18, such as probes 80 and 82, are positioned by positioners 21 to make contact with a portion of an electrical circuit whose leads, for example pads 84 and 86, which are located inside the respective usual spatial range of each probe. Thus, it is seen in FIG. 3A that probe 80 is positioned to make contact with pad 84, which is located inside the usual spatial range x of probe 80, indicated by reference numeral 88, and probe 82 is positioned to make contact with pad 86, which is connected to pad 84 and is located inside the usual spatial range x of probe 82, which is indicated by reference numeral 90.

It is seen in FIG. 3B that two pads, indicated by reference numerals 92 and 94 respectively, are located inside the usual spatial range 90 of one probe, probe 82 being shown. Thus probe 82 is positioned to make contact with pad 92 which is located inside its corresponding usual spatial range 90, while probe 96 is positioned to make contact with pad 94 which is located outside its corresponding usual spatial range 98, but inside the usual spatial range 90 of probe 82 and also inside its extended spatial range as illustrated by penumbra 100. It is appreciated that in the example shown in FIGS. 3A and 3B the extended spatial extent of each probe 18, such as extended spatial range 101 of probe 82, is 2× its usual spatial extent, such the corresponding usual spatial extent x of probe 82, which is designated reference numeral 90.

Figure 4A:
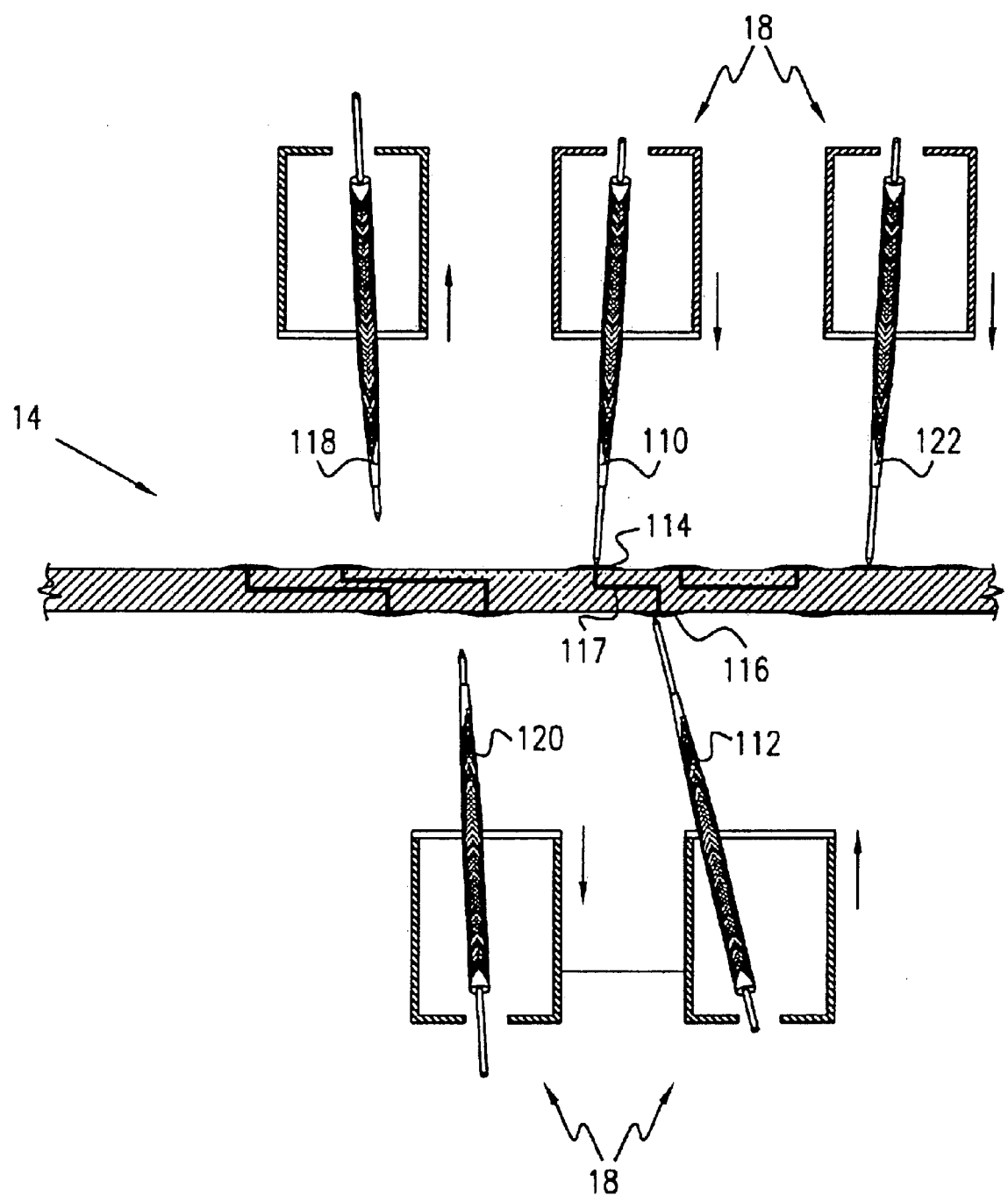
FIGS. 4A, 4B and 4C are simplified side view illustrations of a typical sequence of multiple probe electrical circuit contact engagements provided by the system of FIGS. 1A–3B.
Figure 4B:
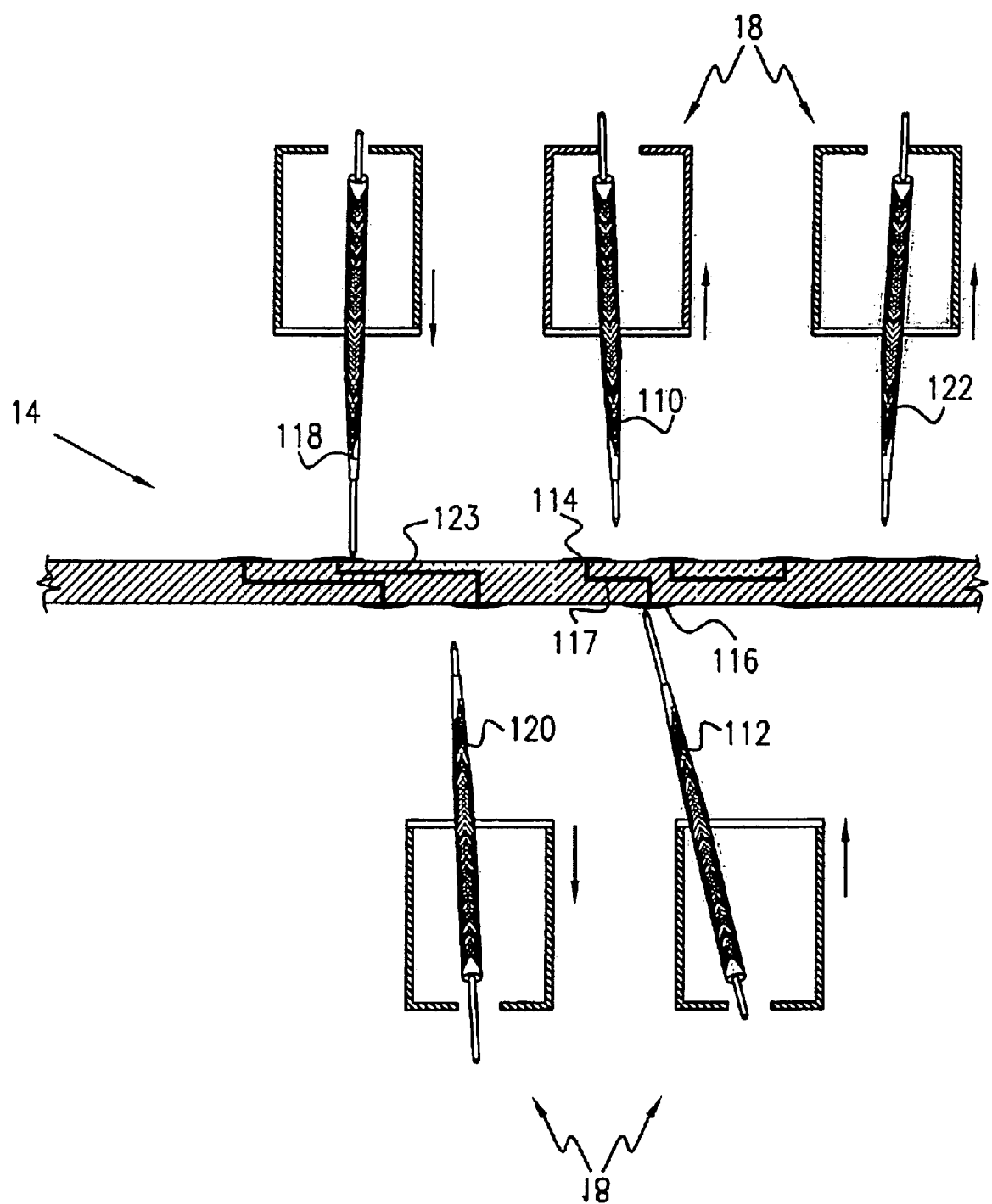
Figure 4C:
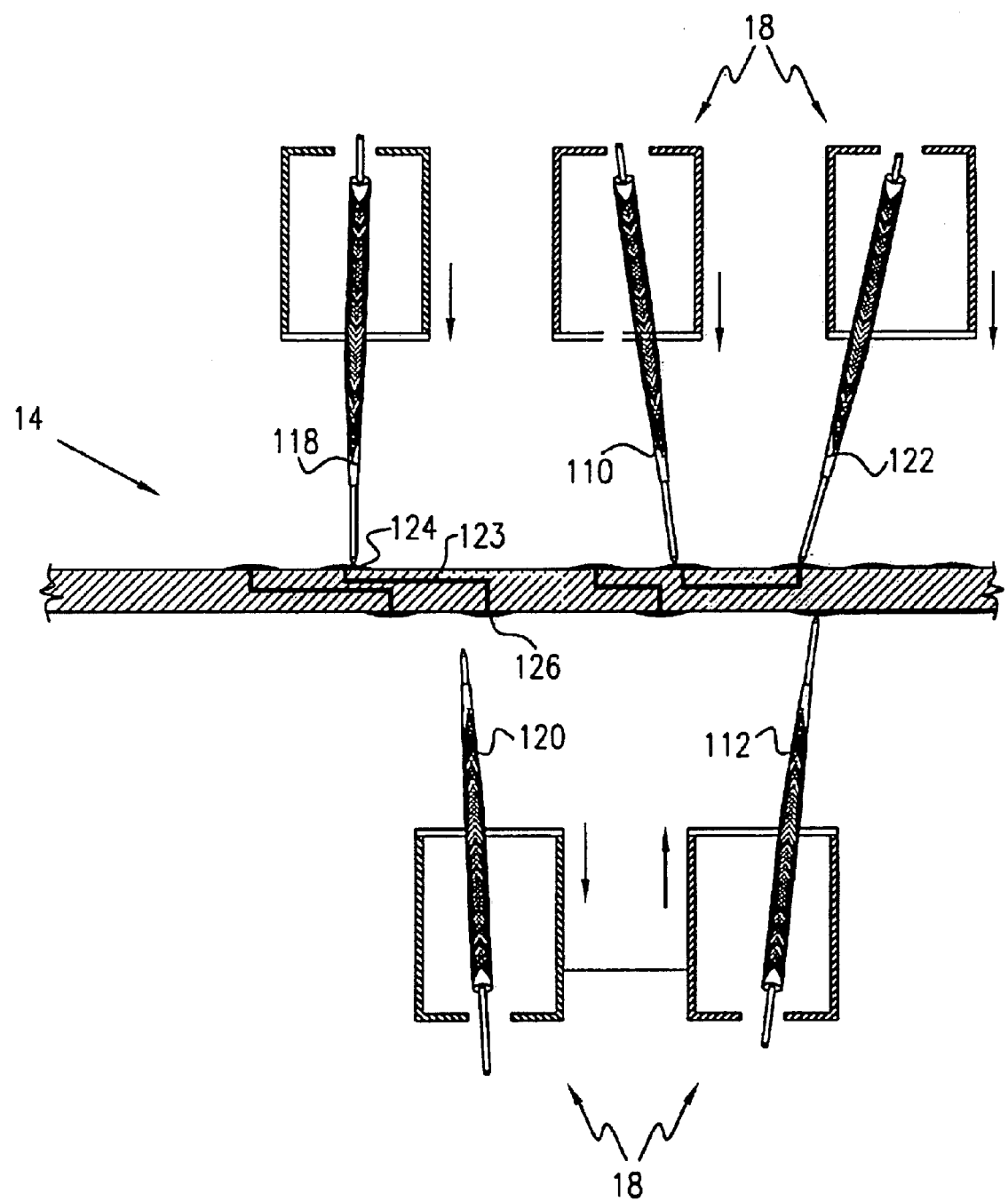

Reference is now made to FIGS. 4A, 4B and 4C which are simplified illustrations of a typical sequence of multiple probe electrical circuit contact engagements provided by the system of FIGS. 1A–3B. As seen in FIGS. 4A, 4B and 4C, probes 18 are located on both sides of electrical circuit 14, such that portions of electrical circuit 14 which have leads on a single side of electrical circuit 14 may be tested for electrical characteristics, and such that portions of electrical circuit 14 which have leads extending from one side to the other may also be tested for electrical characteristics.

In a first stage of testing, seen in FIG. 4A, selected probes 110 and 112 are positioned to make contact with pads 114 and 116 interconnected by interconnecting portion 117 of electrical circuit 14. In accordance with the invention, at least some, and typically all, of the probes 18 (FIG. 1A) are selectively controllable independently of other probes 18. Thus array 12 of probes 18 may be arranged, for example by independently moving probes 18, into a desired testing pattern, to enable testing of multiple combinations of interconnected portions of electrical circuit 14.

It is seen in FIG. 4A, and further in FIGS. 4B and 4C, that while an electrical test, such as the presence of electrical contact, is being performed on a selected interconnected circuit portion, such as portion 117 using selected probes 110 and 112, other probes such as probe 122 (alone or in conjunction with other probes that are not shown) may be used to simultaneously test different portions of electrical circuit 14. Moreover, still other probes, such as probes 118 and 120, simultaneously with the performance of other tests by other probes such as probes 110, 112 and 122, may be moved into position to make contact with other portions of electrical circuit 14 for a subsequent stage of testing.

In a subsequent stage of testing, seen in FIG. 4B, probes 110, 112 and 122 are lifted and moved toward other portions of electrical circuit 14 to be tested, while probes 118 and 120 that had been in transit in the stage shown in FIG. 4A, are positioned to test an additional interconnecting portion 123 extending between pads 124 and 126.

It is seen in FIG. 4B that probe 118 is shown slightly off of pad 124, which may result in a deficient test result. Thus, in the event of a deficient test result, selected probes, in the illustration of FIG. 4B probe 118, may be relocated in order to perform a repeat test to verify or reject a suspected test defect.

It is appreciated from FIG. 4C that repeat testing may occur at the end of a completed test sequence or, as seen in FIG. 4C, on the fly. Thus, for example, repeat testing may take place while a testing routine continues such as is shown by probes 110 and 122 which complete their relocation to test an additional interconnected portion between pads 128 and 130, both of which are located on the same surface of electrical circuit 14.

It is appreciated that in various stages of a testing sequence typically different probes are combined to test various portions of electrical circuit 14. Consequently, electrical testing circuitry typically includes switching circuitry (not shown) operative to change the functional interconnection of probes between subsequent stages of a testing sequence. Thus switching circuitry may be made operative to change the type of testing between the same set of probes, for example interconnectivity or impedance, or alternatively to change the interconnection between various sets of probes so that the probes may be randomly combined so that different combinations of probes each sequentially test different selected portions of electrical circuit 14.

Reference is now made to FIGS. 4D and 4E which are simplified top view illustrations of another sequence of multiple electrical circuit contact engagements provided by the probes of the system of FIGS. 1A–3B. An array of spaced apart probe markers 140 indicate a respective location of static probe assemblies corresponding to probe assemblies 16 in FIGS. 1A and 1B. Several probe markers 140 have associated therewith a box, designated 142, indicating a usual spatial range. Three of probe markers 140 are shown with their respective probes 144, 146 and 148 and with their corresponding extended spatial range represented by extended boxes 150, 152 and 154 respectively.

The array represented by probe markers 140 is characterized by usual spatial ranges, represented by boxes 142 and corresponding to respective probes associated with probe markers 140, being mutually spaced apart from each other. The array is further characterized by extended spatial ranges, seen with respect to extended boxes 150, 152 and 154 associated with probes 144, 146 and 148, being mutually overlapping.

In a first stage of testing, seen in FIG. 4D, probe 144 is positioned to engage a pad (not seen) which is located in the usual spatial range 156 of probe 148, probe 146 is positioned to engage a pad (not seen) which is located in the usual spatial range 158 of probe 144, and probe 148 is positioned to engage a pad (not seen) which is located in extended range represented by extended box 154, but which is not in any usual spatial range 142.

In a subsequent stage of testing, seen in FIG. 4E, probe 144 is positioned to engage a pad (not seen) which is located in the extended spatial range 152 of probe 148, and probe 146 is also positioned to engage a pad (not seen) which is located in extended spatial range 152. Both of probes 144 and 146 are positioned to engage pads which are not located in any usual spatial range 142. Simultaneously, probe 148 is positioned to engage a pad (not seen) which is located in extended range represented by extended box 154, but which also is not in any usual spatial range 142.

It is appreciated that in both of the stages of testing seen in FIGS. 4D and 4E, probes may cross into the corresponding usual spatial ranges of neighboring probes, or engage portions of an electrical circuit that are located outside the usual spatial location of all of the probes. This ability to cross over into spatial ranges generally associated with other probes is intended to enable the avoiding of collisions while moving proves.

Reference is now made to FIG. 5 which is a partially exploded and partially cut-away pictorial illustration of probe assembly 160, corresponding to probe 16 employed in the system of FIG. 1A. It is now seen in detail that probe assembly 160 comprises an extensible conductive probe element 162, formed with a probe tip 164, disposed inside a selectively positionable rigid probe housing 166. In some embodiments of the invention, housing 166 is formed of a carbon or ceramic fiber mesh to provide suitable rigidity and dimensional stability.

As seen in FIG. 5, housing 166 is suspended from a set of annular rings 168 respectively attached to an X-axis positioner 170 operative to move housing 166 in the directions indicated by arrow 172, and a Y-axis positioner 174 operative to move housing 166 in the directions indicated by arrow 176. To provide desired extension and retraction movement so as to engage a portion of an electrical circuit 14 (FIGS. 3A and 3B), a Z-axis positioner 180 is attached to an end portion 182 of extensible probe element 162. Z-axis positioner 180 is operative to move end portion 182 in the direction of arrow 184, 50 that probe element 162 slides inside housing 166 to be selectively extended, or retracted, in relation thereto to engage and disengage a portion of electrical circuit 14 (FIG. 1A).

In the embodiment seen in FIG. 5, each of positioners 170, 174 and 180 includes a tilt actuator 190, 192 and 194 respectively and one or more lever elements 196, 198 and 200 respectively, each operative to amplify the tilt action of actuators 190, 192 and 194. One example of a suitable tilt actuator is a piezoelectric torque actuator such as described in detail in U.S. Pat. No. 6,191,522, the disclosure of which is incorporated herein by reference. Other suitable tilting mechanisms may also be employed.

Figure 6A:
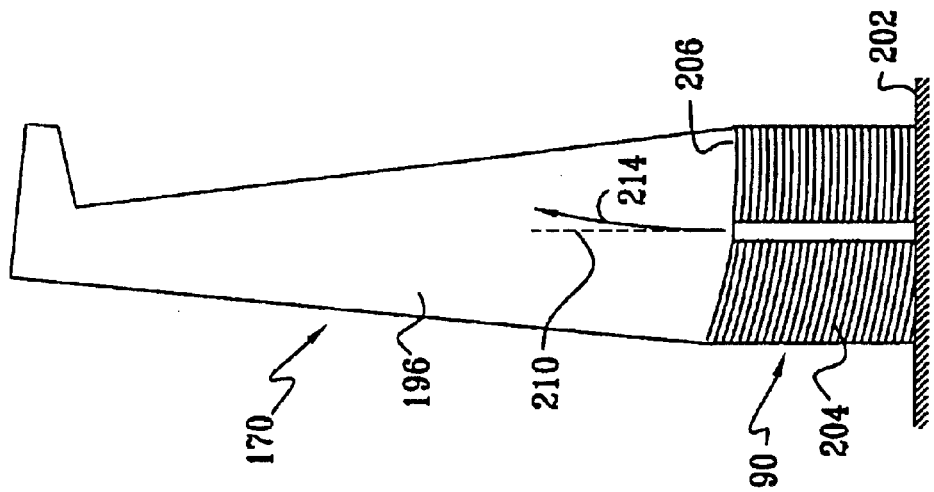
FIGS. 6A–6C are simplified side-view illustrations of the operation of a positioner employed in the probe of FIG. 5.
Figure 6B:
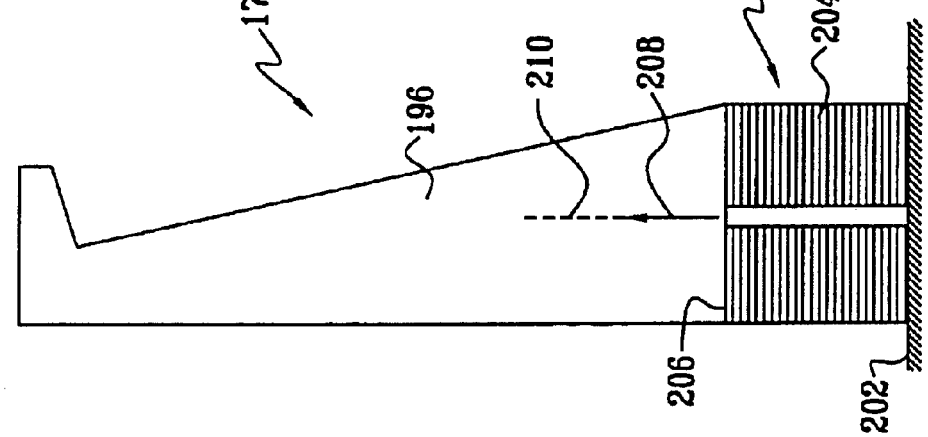
Figure 6C:
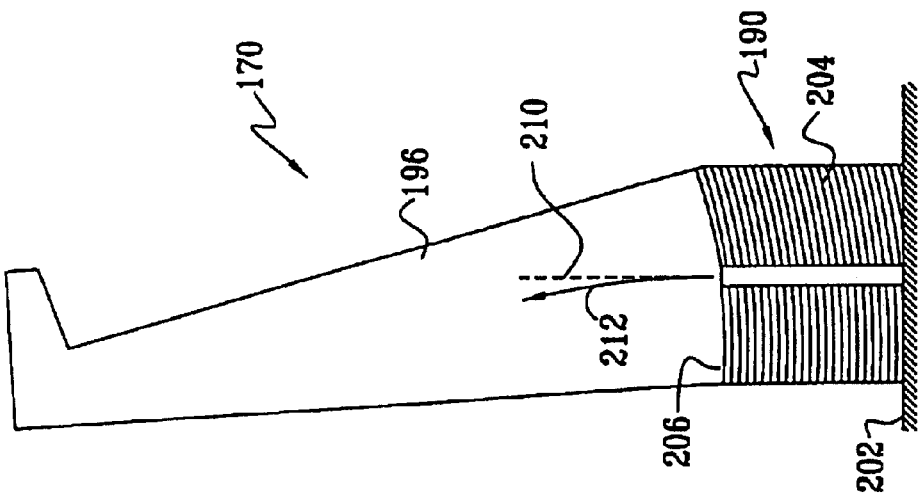

Reference is now made to FIGS. 6A–6C which are simplified side-view illustrations of the operation of a positioner, such as positioner 170 or 174 in FIG. 5. Operation is described with reference to positioner 170, however operation of positioner 174 is substantially the same. Positioner 170 includes a tilt actuator 190, anchored to a probe assembly base element 202, for example with an anchor screw 203 (FIG. 5), and a lever element 196. It is appreciated from FIGS. 6A–6C, and from the description in above-referenced U.S. Pat. No. 6,191,522, that tilt actuators 190 include a plurality of leaf elements 204 operative to expand or contract as a function of an electrical current applied thereto, and thereby to impose a tilt on the top surface 206 of actuator 190. In the absence of current top surface 206 is generally not tilted relative to surface 202 and lever element 196 is generally vertically aligned, as indicated by arrow 208 referenced to vertical axis 210 (FIG. 6B). In response to current applied to actuator 190, top surface 206 tilts relative to vertical axis 210 as shown by arrows 212 and 214 in FIGS. 6A and 6C respectively. It is appreciated that the tilting action of actuator 190 is relatively small, typically in the order of 0.1°, and that lever element 196 translates the small tilt of top surface 201 into a significant linear transposition of the top surface of lever element 196, which is attached to angular rings 168 and 169 (FIG. 5). It is appreciated that the extent of the linear transposition is a design criterion and is related to the length of lever elements 196.

Figure 7A:
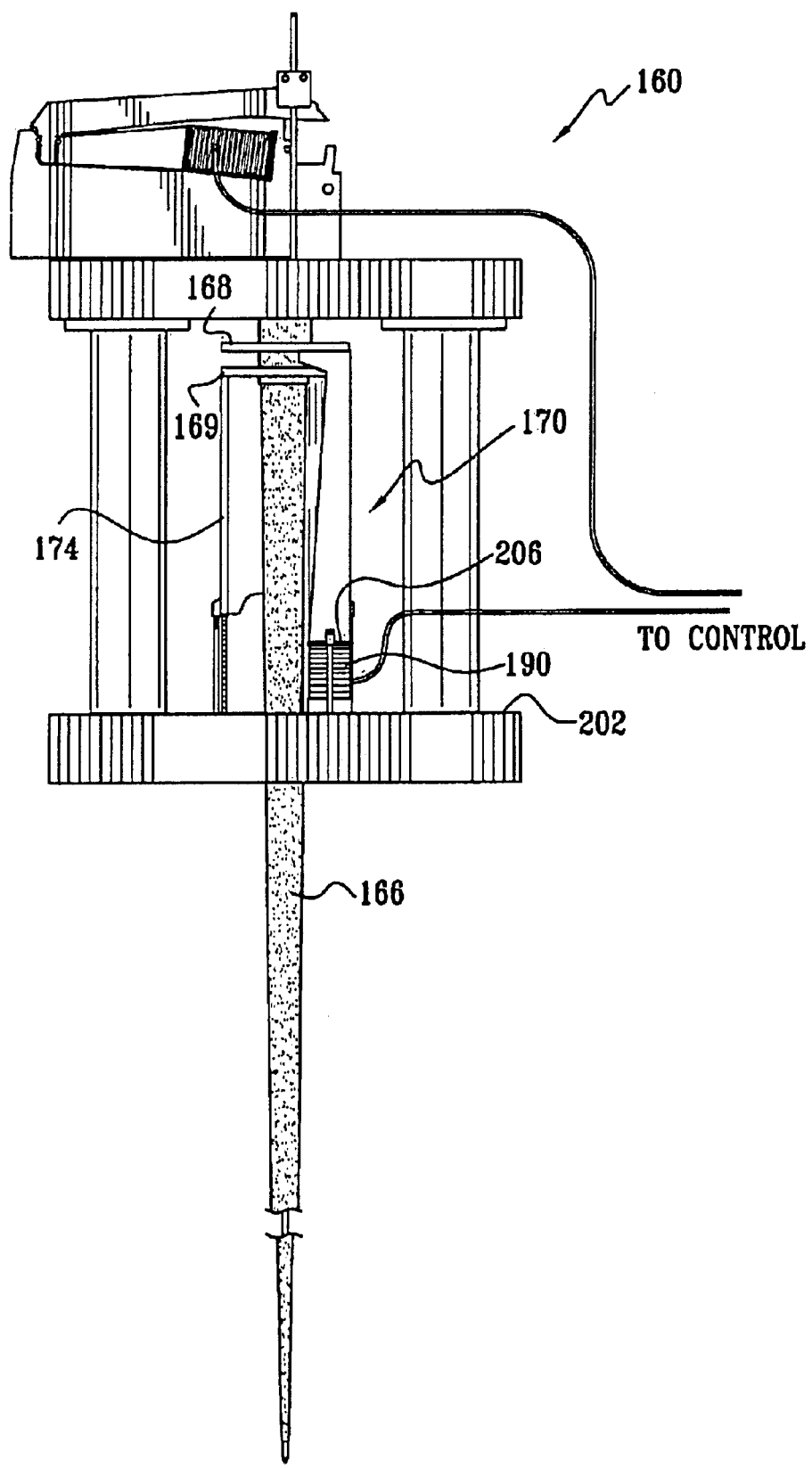
FIGS. 7A–7C are simplified side view pictorials illustrating operation, along a first axis, of a probe assembly employed in the system of FIG. 1A.
Figure 7B:
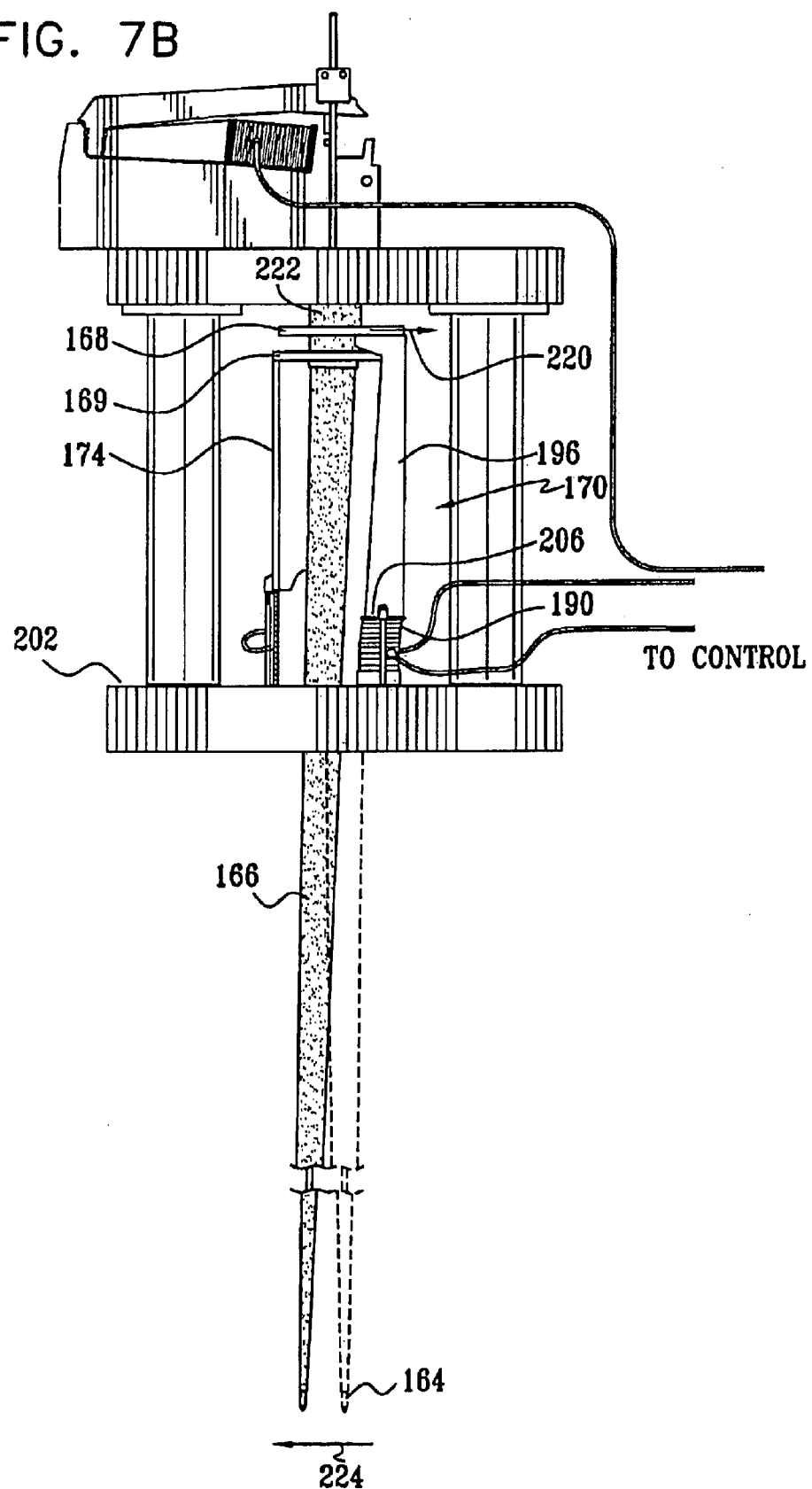
Figure 7C:
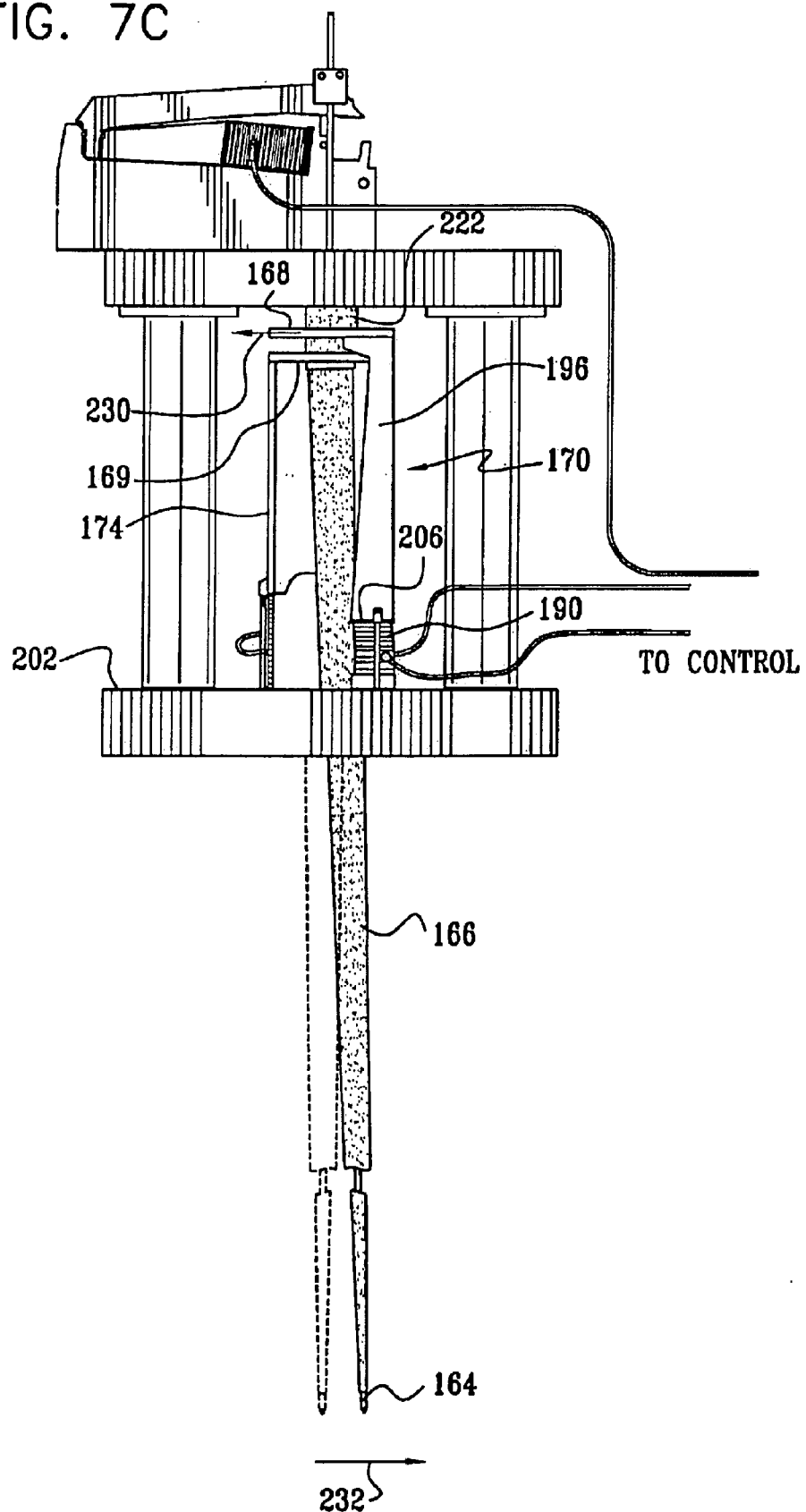

Reference is now made to FIGS. 7A–7C which are simplified side view pictorials illustrating operation of probe assembly 160, corresponding to probe 16 employed in the system of FIG. 1A, along the X-axis. It is appreciated that in FIGS. 7A–7C housing 166 may be positioned at any of various angles of inclination along the Y-axis. In FIG. 7A, positioner 170 is in a neutral position such that the top surface 206 of actuator 190 is generally parallel to the surface of base 202, and probe housing 166 is generally vertically aligned to the X-axis. In FIG. 7B it is seen that when current is applied to actuator 190, top surface 206 is tilted and lever element 196 tilts in the direction of arrow 220. Inasmuch as housing 166 is suspended from annular rings 168 and 169, ring 168, which is attached to lever element 196, pulls a top portion 222 of housing 166 in the direction of arrow 220 to lever against a fulcrum at ring 169 and thus move probe tip 164 in the direction of arrow 224 relative to its position in FIG. 7A. In FIG. 7C it is seen that when current is applied to actuator 190, the current applied in FIG. 7C being differently characterized than the current applied in FIG. 7B, top surface 206 is tilted and lever element 196 tilts in the direction of arrow 230. Inasmuch as housing 166 is suspended from annular rings 168 and 169, ring 168, which is attached to lever element 198, pushes a top portion 222 of housing 168 in the direction of arrow 230 to lever against a fulcrum at ring 169 and thus move probe tip 164 in the direction of arrow 232 relative to its position in FIG. 7A.

Figure 8A:
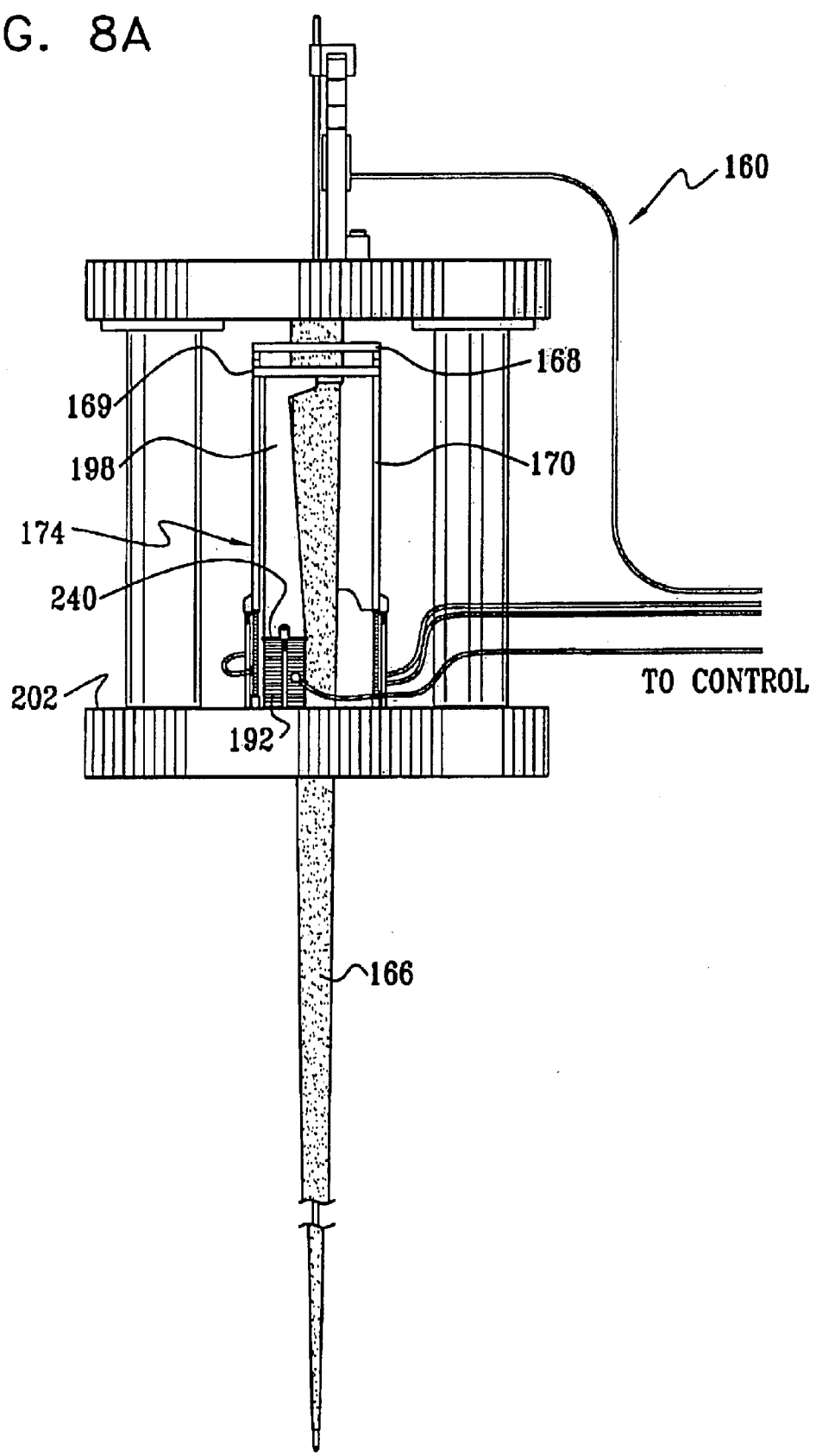
FIGS. 8A–8C are simplified side view pictorials illustrating operation, along a second axis, of a probe assembly employed in the system of FIG. 1A.
Figure 8B:
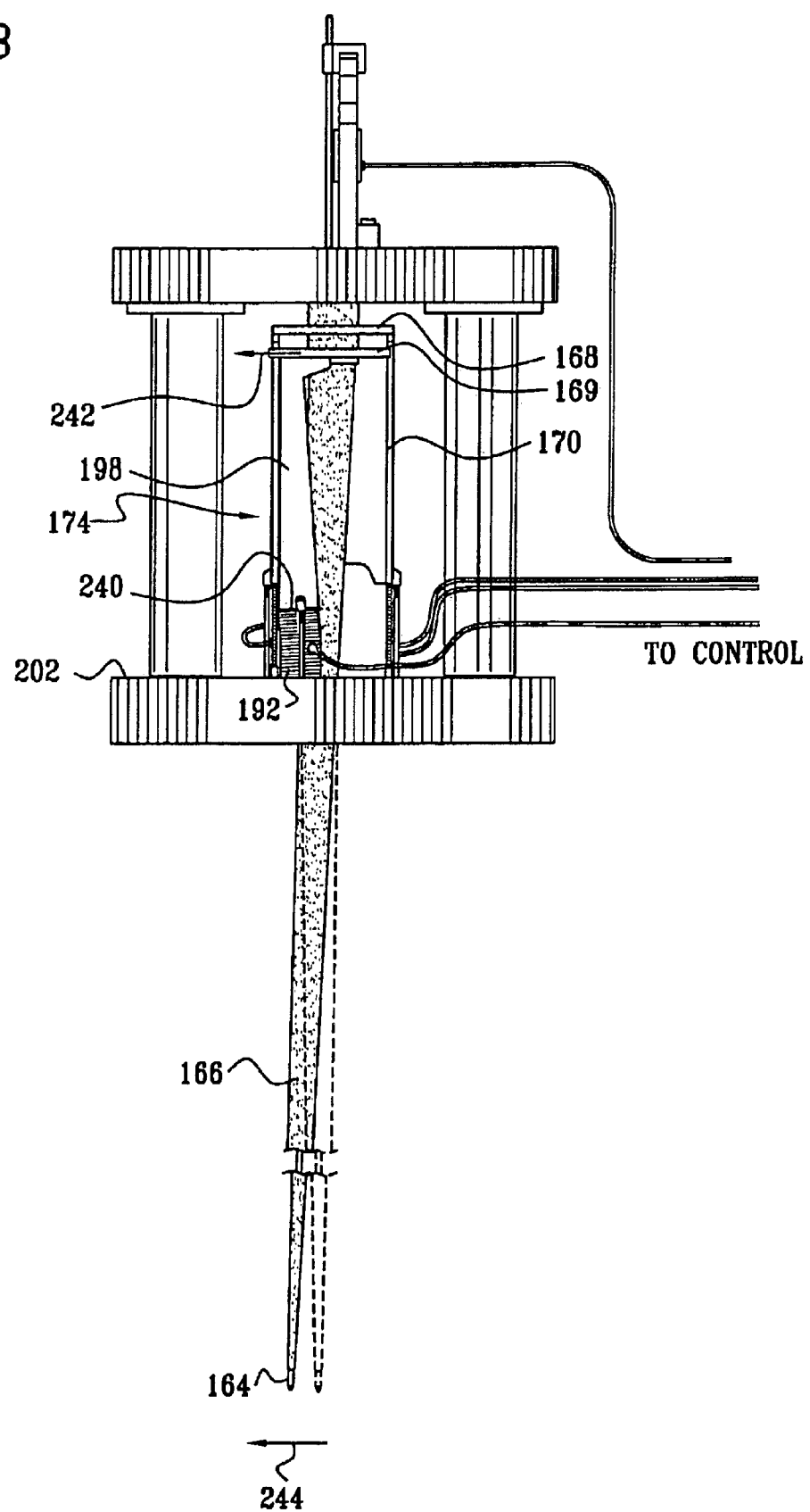
Figure 8C:
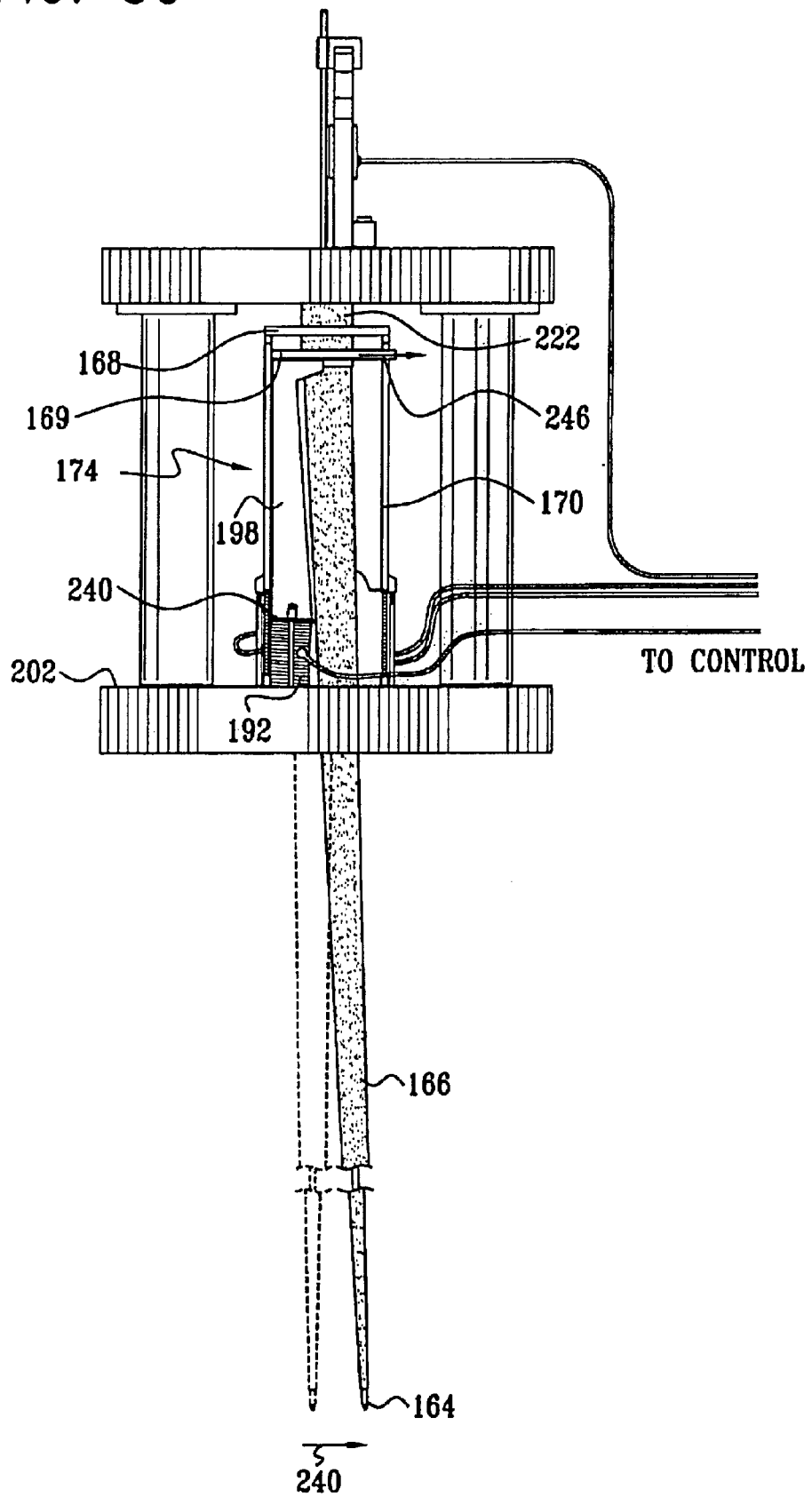

Reference is now made to FIGS. 8A–8C which are simplified side view pictorials illustrating operation of probe assembly 160, corresponding to probe 16 employed in the system of FIG. 1A, along the Y-axis. It is appreciated that in FIGS. 8A–8C housing 166 may be positioned at any of various angles of inclination along the X-axis. In FIG. 8A, positioner 174 is in a neutral position such that the top surface 240 of actuator 192 is generally parallel to the surface of base 202, and probe housing 166 is generally vertical along the Y-axis. In FIG. 8B it is seen that in response to current applied to actuator 192, top surface 240 is tilted and lever element 198 tilts in the direction of arrow 242. Inasmuch as housing 166 is suspended from annular rings 168 and 169, ring 169, being attached to lever 198, pulls a top portion 222 of housing 166 in the direction of arrow 242 to lever against a fulcrum at ring 168 and thus move probe tip 164 in the direction of arrow 244 relative to its position in FIG. 8A. In FIG. 8C, it is seen that in response to current applied to actuator 192, the current applied in FIG. 8C being differently characterized than the current applied in FIG. 8B, top surface 240 is tilted and lever element 198 tilts in the direction of arrow 246. Inasmuch as housing 166 is suspended from annular rings 168 and 169, ring 169, being attached to lever 192, pushes top portion 222 of housing 166 in the direction of arrow 246 to lever against a fulcrum at ring 168 and thus moves probe tip 164 in the direction of arrow 248 relative to its position in FIG. 7A. It is appreciated that positioning of tip 164 along the Y axis is independent of its positioning along the X-axis.

Reference is now made to FIGS. 9A–9D in which FIG. 9A is a simplified side view pictorial illustrating operation of probe assembly 160, corresponding to probe 16 employed in the system of FIG. 1A, along the Z-axis, and in which FIGS. 9B–9D are magnified views of respective portions of the probe assembly 160 to further illustrate its operation. As seen in FIG. 9A, Z-axis positioner 180 includes tilt actuator 194 and a pair of tilt arms 250 and 252 forming lever element 200. It is noted that tilt arms 250 and 252 are joined at first and second fulcrum points 254 and 256, respectively, and that suitable clearances 258 are provided to permit mutual flexing of tilt arms 250 and 252 as indicated by arrow 260. See FIG. 9B. Thus as actuator 194 produces a tilt action indicated by arrow 262, first tilt arm 250 is biased upwards or downwards at fulcrum 254, which in turn biases second tilt arm 252 upwards or downwards in an amplified linear transposition indicated by arrow 264. See FIG. 9C. In the embodiment seen in FIGS. 9A–9C, lever element is formed of a single unit block of pliable metal, for example aluminum, in which clearances are cut away such as with a laser.

As further seen in FIGS. 9A and 9C, the tilt arm 252 is connected to extensible conductive probe element 162, so that upward and downward movement of tilt arm 252 translates to movement of probe tip 164 by a distance L. See FIG. 9D. Thus, inasmuch as probe element 162 is formed of a flexible metal, such as for example copper, probe tip 164 may be selectively extended or retracted with reference to housing 166, independently of the orientation of housing 166 in an X-Y plane.

Figure 10A:
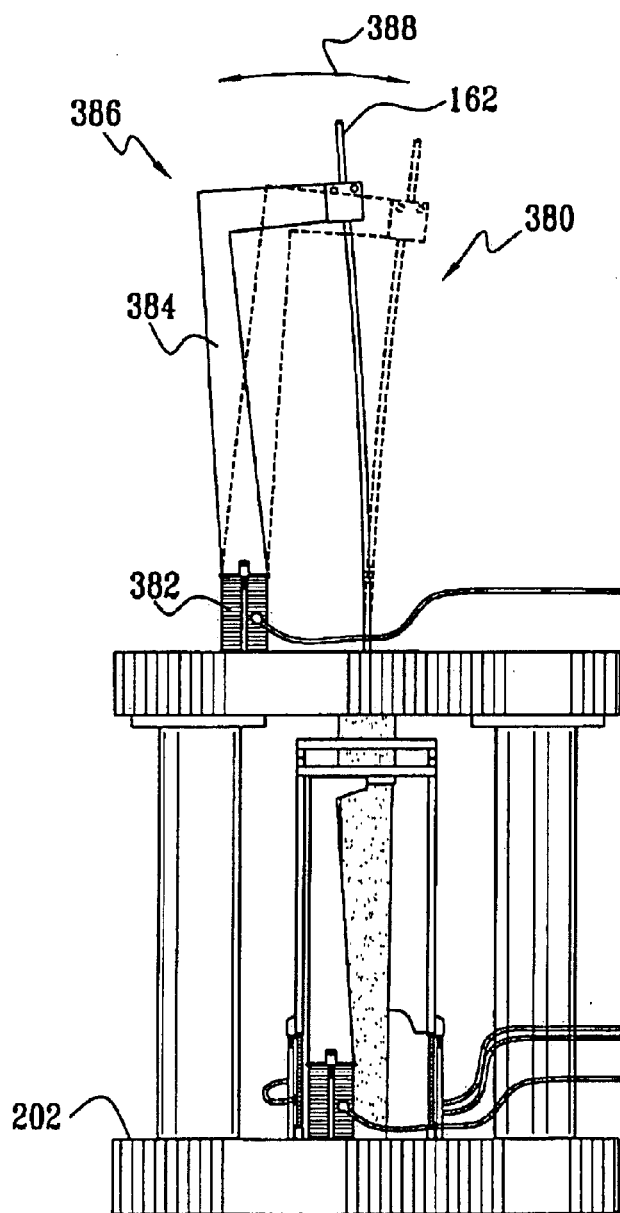
FIG. 10A is a simplified side view pictorial illustrating operation, along a third axis, of a second embodiment of a probe assembly employed in the system of FIG. 1A.
Figure 10B:
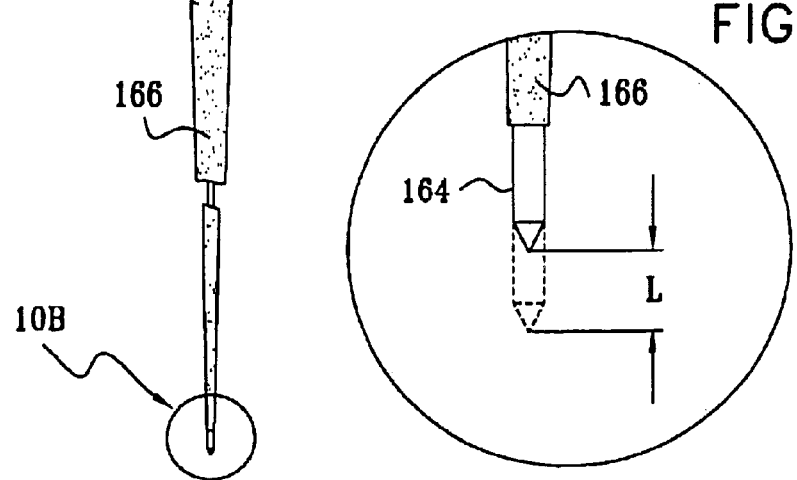
FIG. 10B is a magnified view of a portion of the probe assembly seen in FIG. 10A to illustrate its operation.

Reference is now made to FIGS. 10A–10B in which FIG. 10A is a simplified side view pictorial illustrating operation along the Z axis of a probe assembly 360, corresponding to probe 16 and having an alternative construction, employed in the system of FIG. 1A, and in which FIGS. 10B is a magnified view of respective portions of the probe assembly 360 to further illustrate its operation. As seen in FIG. 10A, Z-axis positioner 380 includes a tilt actuator 382 and a tilt arm 384 forming a lever element 386 which attached to extensible probe element 162. Thus as tilt actuator 382 produces a tilt action lever element is biased in the direction of arrow 388 causing an upward and downward movement of probe element 164 and probe tip 164. See FIG. 10B. Thus, inasmuch as probe element 162 is formed of a flexible metal, such as for example copper, probe tip 164 may be selectively extended or retracted with reference to housing 166, independently of the orientation of housing 166 in an X-Y plane.

It is appreciated from FIGS. 5–10B that a probe element 18 (FIG. 1A) may be positioned at any of a multiplicity of spatial orientations so that a probe tip can engage a multiplicity of locations within a generally square field. Typically it is necessary to occasionally perform a calibration function in order to determine the characteristics of current that need to be applied at actuators 190 and 192 in order to suitably orient housing 166 at selected locations, and in order to suitably extend tip 164 so that a desired amount of pressure is applied when engaging electrical circuit 14.

It is appreciated that the arrangement of a probe 160 described with respect to FIGS. 5–10B is to be considered to be exemplary and non-limiting. Thus, for example, any suitable tilt action actuator may be employed, such as a suitable stepper motor or nano-motor. Additionally, the structure of a probe so as to provide suitable transposition of a probe element may be modified in accordance with various design considerations.

Reference is now made to FIGS. 11–14 which are flow charts illustrating methods for electrically testing electrical circuits in accordance with the invention. These methods utilize apparatus described hereinabove with reference to FIGS. 1A–9D and are generally self-explanatory in the context of a fixtureless electrical testing system comprising a multiplicity of static probe assemblies arranged in a fixed array, each comprising an independently and selectively positionable probe element used to electrically test portions of electrical circuits. It is further appreciated that the methods illustrated in FIGS. 11–14 typically would be employed in the manufacture of printed circuit boards. Thus, in accordance with the invention, a process for the manufacture of printed circuit boards includes depositing a pattern of conductor portions on a multi-layered substrate by any conventional printed circuit board manufacturing process or any other suitable process, and then electrically testing various electrical characteristics of portions of the electrical circuit using apparatus described hereinabove and/or employing methods illustrated in FIGS. 11–14.

While the above invention has been generally described in the context of a a contact electrical testing system, probes which electrically engage, but which do not physically contact portions of electrical circuit 14, may be employed. Suitable probes include, for example plasma probes.

It is appreciated by persons skilled in the art that the present invention is not limited to what has been particularly shown and described hereinabove. Rather, the scope of the present invention is defined only by the claims that follow.

What is claimed is:

1. A process for manufacturing electrical circuits comprising:
   forming an electrical circuit on a multi-layered substrate;
   supporting at least one probe in a static probe assembly forming part of a fixed array of static probe assemblies, said at least one probe being configured to be independently positionable respective of other probes and to be leverable against a fulcrum;
   tilting at least one armature to lever a first at least one probe against a corresponding fulcrum, thereby moving a tip of said first at least one probe to a selectable location;
   selectively engaging portions of said electrical circuit with said at least one probe; and
   sensing electrical characteristics of the portions of said electrical circuit engaged by said at least one probe.

2. The process claimed in claim 1 and wherein said forming an electrical circuit comprises depositing a pattern of electrical conductor portions on a multi-layered substrate.

3. The process claimed in claim 1 and wherein said selectively engaging portions comprises selectively engaging portions of said electrical circuit with probes that are independently positionable over a region which is generally non-overlapping with a corresponding region of another probe which is not adjacent thereto.

4. The process claimed in claim 3 and wherein said selectively engaging portions comprises selectively engaging portions of said electrical circuit with probes that are independently positionable over a region which is partially overlapping with a corresponding region of another probe which is adjacent thereto.

5. The process claimed in claim 1 and wherein said selectively engaging portions comprises selectively engaging portions of said electrical circuit with probes that are independently positionable over a region which is partially overlapping with a corresponding region of another probe which is adjacent thereto.

6. The process claimed in claim 1 and wherein said selectively engaging comprises selectively engaging portions of said electrical circuit with an independently positionable probe, each independently positionable probe being associated with a static probe assembly, each static probe assembly being disposed at a fixed location in said fixed array.

7. The process claimed in claim 1 and wherein said selectively engaging comprises sequentially positioning said at least one probe in a plurality of position patterns for testing a plurality of circuit elements in said electrical circuit.

8. The process claimed in claim 1 and wherein said selectively engaging comprises selectively positioning a first plurality of probe elements in a first position pattern and sensing electrical characteristics of electrical circuits engaged thereby, and simultaneously moving a second plurality of probe elements into a second position pattern.

9. The process claimed in claim 1 and wherein said selectively engaging comprises selectively engaging at least one portion of said electrical circuit at least partially extending along a first side thereof with a first probe and with a second probe both located along said first side.

10. The process claimed in claim 1 and wherein said selectively engaging comprises selectively engaging at least one portion of said electrical circuit passing from a first side to a second side of said electrical circuit with a first probe located along said first side and with a second probe located along said second side.

11. The process claimed in claim 10 and wherein said selectively engaging comprises engaging at least one portion of said electrical circuit at least partially extending along said first side with said first probe and with a third probe additionally located along said first side.

12. The process claimed in claim 1 and wherein said selectively engaging comprises providing multiple configurations of probes and said sensing comprises sensing a different electrical characteristic in each of said multiple configurations.

13. The process claimed in claim 12 and wherein providing said multiple configurations comprises disposing said probes so as to engage different portions of said electrical circuit in each configuration of probes.

14. The process claimed in claim 1 and wherein said sensing comprises physically touching the portions of electrical circuits to be tested.

15. The process claimed in claim 1 and wherein said sensing comprises forming electrical contact, but not physical contact, with the portions of electrical circuits to be tested.

16. A process for manufacturing electrical circuits comprising:
   forming an electrical circuit on a multi-layered substrate;
   supporting at least one probe in a static probe assembly forming part of a fixed array of static probe assemblies, said at least one probe being configured to be independently positionable respective of other probes and to be leverable against a fulcrum;
   applying electric current to at least one piezo electric actuator associated with a static probe assembly to bias said at least one probe against a fulcrum to tilt said at least one probe in a desired direction;
   selectively engaging portions of said electrical circuit with said at least one probe; and
   sensing electrical characteristics of the portions of said electrical circuit engaged by said at least one probe.

17. The process claimed in claim 16 and wherein said forming an electrical circuit comprises depositing a pattern of electrical conductor portions on a multi-layered substrate.

18. The process claimed in claim 16 and wherein said selectively engaging portions comprises selectively engaging portions of said electrical circuit with probes that are independently positionable over a region which is generally non-overlapping with a corresponding region of another probe which is not adjacent thereto.

19. The process claimed in claim 18 and wherein said selectively engaging portions comprises selectively engaging portions of said electrical circuit with probes that are independently positionable over a region which is partially overlapping with a corresponding region of another probe which is adjacent thereto.

20. The process claimed in claim 16 and wherein said selectively engaging portions comprises selectively engaging portions of said electrical circuit with probes that are independently positionable over a region which is partially overlapping with a corresponding region of another probe which is adjacent thereto.

21. The process claimed in claim 16 and wherein said selectively engaging comprises selectively engaging portions of said electrical circuit with an independently positionable probe, each independently positionable probe being associated with a static probe assembly, each static probe assembly being disposed at a fixed location in said fixed array.

22. The process claimed in claim 16 and wherein said selectively engaging comprises sequentially positioning said at least one probe in a plurality of position patterns for testing a plurality of circuit elements in an electrical circuit.

23. The process claimed in claim 16 and wherein said selectively engaging comprises selectively positioning a first plurality of probe elements in a first position pattern and sensing electrical characteristics of electrical circuits engaged thereby, and simultaneously moving a second plurality of probe elements into a second position pattern.

24. The process claimed in claim 16 and wherein said selectively engaging comprises selectively engaging at least one portion of said electrical circuit at least partially extending along a first side thereof with a first probe and with a second probe both located along said first side.

25. The process claimed in claim 16 and wherein said selectively engaging comprises selectively engaging at least one portion of said electrical circuit passing from a first side to a second side of said electrical circuit with a first probe located along said first side and with a second probe located along said second side.

26. The process claimed in claim 25 and wherein said selectively engaging comprises engaging at least one portion of said electrical circuit at least partially extending along said first side with said first probe and with a third probe additionally located along said first side.

27. The process claimed in claim 16 and wherein said selectively engaging comprises providing multiple configurations of probes and said sensing comprises sensing a different electrical characteristic in each of said multiple configurations.

28. The process claimed in claim 27 and wherein providing said multiple configurations comprises a disposing said probes so as to engage different portions of said electrical circuit in each configuration of probes.

29. The process claimed in claim 16 and wherein said sensing comprises physically touching the portions of electrical circuits to be tested.

30. The process claimed in claim 16 and wherein said sensing comprises forming electrical contact, but not physical contact, with the portions of electrical circuits to be tested.

* * * * *